United States Patent
Huang et al.

(10) Patent No.: US 11,631,658 B2
(45) Date of Patent: *Apr. 18, 2023

(54) UNDER-BUMP-METALLIZATION STRUCTURE AND REDISTRIBUTION LAYER DESIGN FOR INTEGRATED FAN-OUT PACKAGE WITH INTEGRATED PASSIVE DEVICE

(71) Applicant: Taiwan Semiconductor Manufacturing Co., Ltd., Hsinchu (TW)

(72) Inventors: Yu-Chih Huang, Hsinchu (TW); Chi-Hui Lai, Taichung (TW); Ban-Li Wu, Hsinchu (TW); Ying-Cheng Tseng, Tainan (TW); Ting-Ting Kuo, Hsinchu (TW); Chih-Hsuan Tai, Taipei (TW); Hao-Yi Tsai, Hsinchu (TW); Chuei-Tang Wang, Taichung (TW); Chung-Shi Liu, Hsinchu (TW); Chen-Hua Yu, Hsinchu (TW); Chiahung Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 72 days.

This patent is subject to a terminal disclaimer.

(21) Appl. No.: 17/099,179

(22) Filed: Nov. 16, 2020

(65) Prior Publication Data

US 2021/0074694 A1 Mar. 11, 2021

Related U.S. Application Data

(63) Continuation of application No. 16/129,479, filed on Sep. 12, 2018, now Pat. No. 10,840,227.

(Continued)

(51) Int. Cl.
*H01L 25/16* (2006.01)
*H01L 23/498* (2006.01)
(Continued)

(52) U.S. Cl.
CPC ........ *H01L 25/162* (2013.01); *H01L 21/4857* (2013.01); *H01L 21/50* (2013.01);
(Continued)

(58) Field of Classification Search
CPC .......... H01L 21/4857; H01L 23/49838; H01L 25/162; H01L 25/105; H01L 25/16;
(Continued)

(56) References Cited

U.S. PATENT DOCUMENTS 10,165,682 B2 12/2018 Hsieh et al.
10,840,227 B2 * 11/2020 Huang ................ H01L 21/4857
(Continued)

FOREIGN PATENT DOCUMENTS

CN 104882417 A * 9/2015 ........... H01L 25/165
KR 20170077757 A 7/2017
(Continued)

*Primary Examiner* — Alexander O Williams
(74) *Attorney, Agent, or Firm* — Slater Matsil, LLP

(57) ABSTRACT

A semiconductor package includes an integrated passive device (IPD) including one or more passive devices over a first substrate; and metallization layers over and electrically coupled to the one or more passive devices, where a topmost metallization layer of the metallization layers includes a first plurality of conductive patterns; and a second plurality of conductive patterns interleaved with the first plurality of conductive patterns. The IPD also includes a first under bump metallization (UBM) structure over the topmost metallization layer, where the first UBM structure includes a first plurality of conductive strips, each of the first plurality of conductive strips electrically coupled to a respective one of the first plurality of conductive patterns; and a second (Continued)

plurality of conductive strips interleaved with the first plurality of conductive strips, each of the second plurality of conductive strips electrically coupled to a respective one of the second plurality of conductive patterns.

20 Claims, 22 Drawing Sheets

Related U.S. Application Data

(60) Provisional application No. 62/580,885, filed on Nov. 2, 2017.

(51) Int. Cl.
    *H01L 21/48*      (2006.01)
    *H01L 21/50*      (2006.01)
    *H01L 23/31*      (2006.01)
    *H01L 25/10*      (2006.01)
    *H01L 23/00*      (2006.01)
    *H01G 4/00*      (2006.01)
    *H01L 25/065*      (2006.01)

(52) U.S. Cl.
CPC .... *H01L 23/3128* (2013.01); *H01L 23/49822* (2013.01); *H01L 23/49838* (2013.01); *H01L 24/20* (2013.01); *H01L 25/105* (2013.01); *H01L 25/16* (2013.01); *H01G 4/00* (2013.01); *H01L 24/08* (2013.01); *H01L 24/16* (2013.01); *H01L 24/32* (2013.01); *H01L 24/48* (2013.01); *H01L 24/73* (2013.01); *H01L 25/0657* (2013.01); *H01L 2224/04105* (2013.01); *H01L 2224/08225* (2013.01); *H01L 2224/12105* (2013.01); *H01L 2224/16227* (2013.01); *H01L 2224/16235* (2013.01); *H01L 2224/16265* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2224/73267* (2013.01); *H01L 2225/0651* (2013.01); *H01L 2225/06568* (2013.01); *H01L 2225/1035* (2013.01); *H01L 2225/1058* (2013.01); *H01L 2924/1205* (2013.01); *H01L 2924/1206* (2013.01); *H01L 2924/15311* (2013.01); *H01L 2924/15313* (2013.01); *H01L 2924/18161* (2013.01); *H01L 2924/18162* (2013.01); *H01L 2924/19011* (2013.01); *H01L 2924/19041* (2013.01); *H01L 2924/19042* (2013.01); *H01L 2924/19104* (2013.01); *H01L 2924/19105* (2013.01)

(58) Field of Classification Search
CPC ................ H01L 21/50; H01L 23/3128; H01L 23/49822; H01L 24/20; H01L 2224/12105; H01L 2224/16235; H01L 2224/16265; H01L 24/48; H01L 2924/18162; H01L 2224/04105; H01L 25/0657; H01L 2224/32225; H01L 2224/73265; H01L 2224/73267; H01L 2924/1206; H01L 24/16; H01L 2224/08225; H01L 2924/19011; H01L 2924/19105; H01L 23/5389; H01L 2224/16227; H01L 2224/18; H01L 24/32; H01L 2225/1058; H01L 2924/19042; H01L 2924/1205; H01L 2224/48227; H01L 2225/06568; H01L 2924/15313; H01L 2225/1035; H01L 2924/19041; H01L 2224/32145; H01L 2924/19104; H01L 24/73; H01L 2224/73204; H01L 2924/15311; H01L 2225/0651; H01L 24/08; H01L 2924/18161; H01L 2924/00012; H01L 2924/00; H01L 2924/0001; H01L 2224/16225; H01L 2940/00; H01L 2224/1035; H01L 224/12105; H01L 21/48; H01L 25/065; H01L 25/10; H01L 23/00; H01L 23/498; H01G 4/00; H01G 4/40
USPC .......................................... 257/668
See application file for complete search history.

(56) References Cited

U.S. PATENT DOCUMENTS

| | | |
|---|---|---|
| 2015/0123759 A1 | 5/2015 | Chuang et al. |
| 2017/0188458 A1 | 6/2017 | Hsieh et al. |
| 2017/0207197 A1 | 7/2017 | Yu et al. |
| 2017/0221819 A1 | 8/2017 | Chu et al. |
| 2017/0229322 A1 | 8/2017 | Hsu et al. |
| 2017/0365587 A1 | 12/2017 | Hung et al. |
| 2018/0033771 A1 | 2/2018 | Yu et al. |
| 2018/0082988 A1 | 3/2018 | Cheng et al. |
| 2019/0148262 A1 | 5/2019 | Pei et al. |
| 2019/0157208 A1 | 5/2019 | Lin et al. |
| 2019/0164783 A1 | 5/2019 | Huang et al. |
| 2019/0304803 A1 | 10/2019 | Hu et al. |
| 2019/0371781 A1 | 12/2019 | Huang et al. |
| 2020/0411443 A1* | 12/2020 | Guo ................. H01L 24/09 |
| 2021/0391317 A1* | 12/2021 | Wu .................. H01L 25/18 |

FOREIGN PATENT DOCUMENTS

| | | | | |
|---|---|---|---|---|
| KR | 20170094484 A | | 8/2017 | |
| KR | 20220026996 A | * | 3/2022 | ............ H01I 23/52 |
| TW | 201724427 A | | 7/2017 | |
| WO | 2017111957 A1 | * | 6/2017 | ......... H01L 26/0655 |

\* cited by examiner

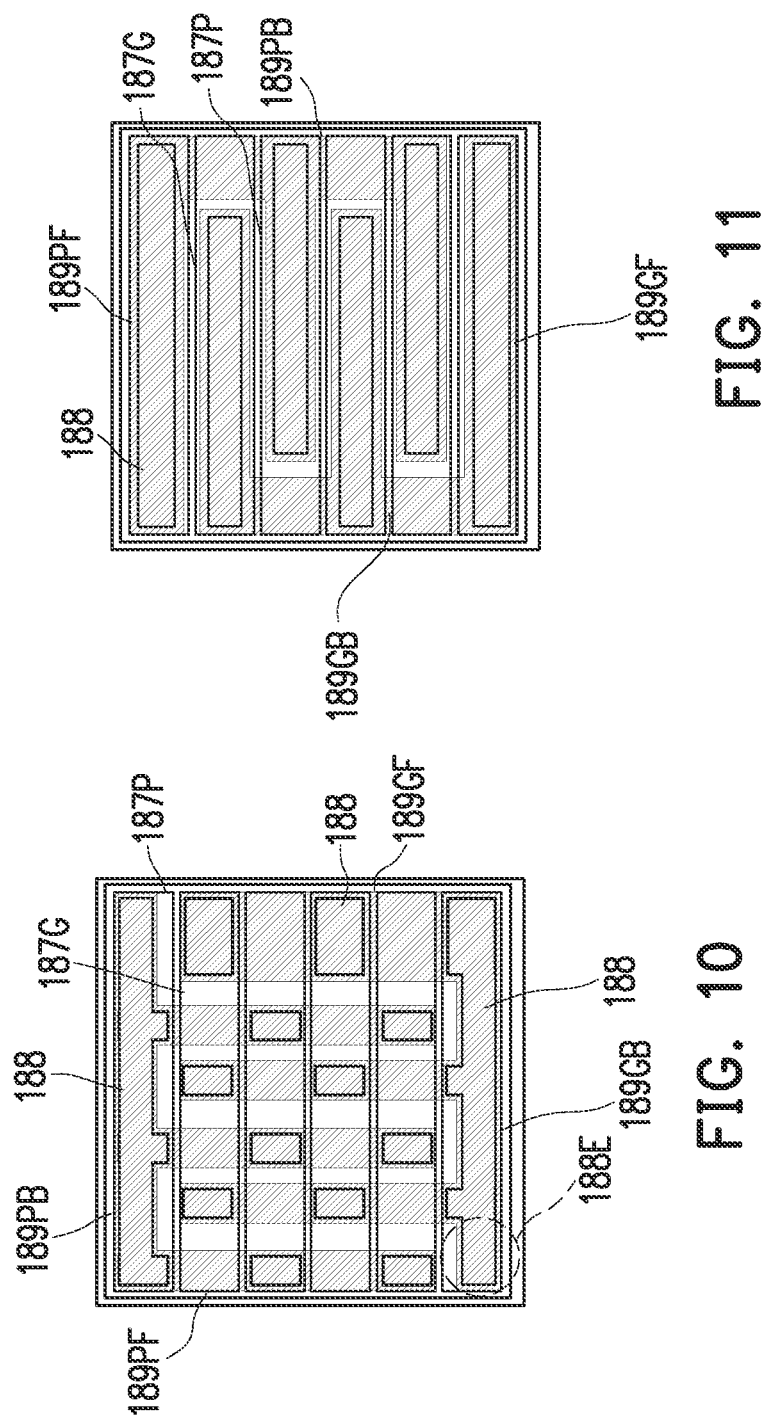

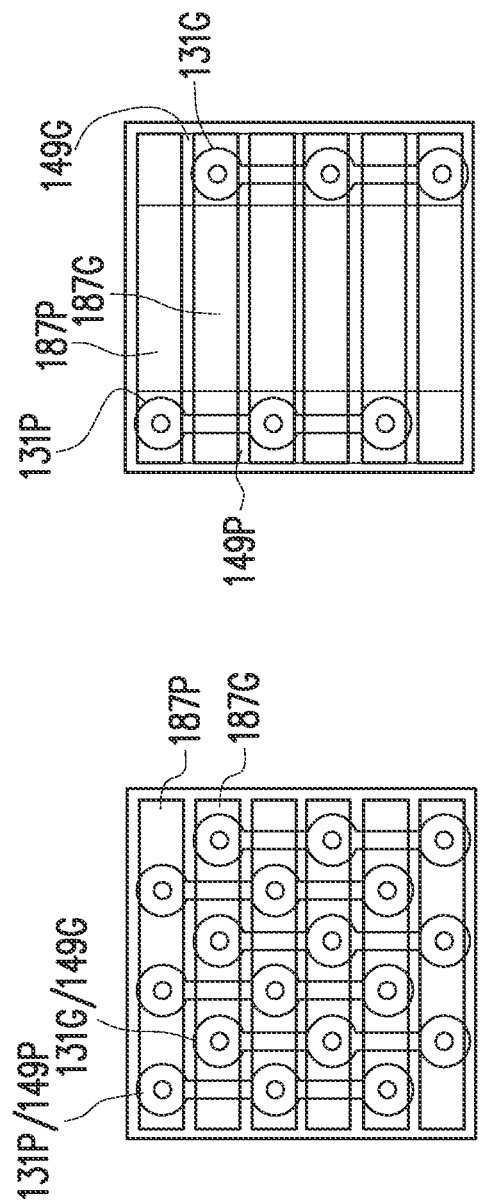

```
┌─────────────────────┐
│  3010 — form an interconnect structure over passive devices over a substrate, the interconnect structure electrically coupled to the passive devices, a top metallization layer of the interconnect structure comprising first metal patterns and second metal patterns parallel to the first metal patterns  │
└─────────────────────┘
             │
             ▼
┌─────────────────────┐
│  3020 — form a first under bump metallization (UBM) structure over the interconnect structure, the first UBM structure comprising first metal strips and second metal strips parallel to the first metal strips, the first metal strips electrically coupled to respective ones of the first metal patterns, and the second metal strips electrically coupled to respective ones of the second metal patterns  │
└─────────────────────┘

3000

FIG. 24
```

UNDER-BUMP-METALLIZATION STRUCTURE AND REDISTRIBUTION LAYER DESIGN FOR INTEGRATED FAN-OUT PACKAGE WITH INTEGRATED PASSIVE DEVICE

PRIORITY AND CROSS REFERENCE

This application is a continuation of U.S. patent application Ser. No. 16/129,479, filed Sep. 12, 2018, entitled "Under-Bump-Metallization Structure and Redistribution Layer Design for Integrated Fan-Out Package with Integrated Passive Device," now U.S. Pat. No. 10,840,227, issued Nov. 17, 2020, which claims priority to U.S. Provisional Patent Application No. 62/580,885, filed Nov. 2, 2017, entitled "UBM and RDL Design for High Performance IPD in InFO," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the integrated fan-out (InFO) package technology. In an InFO package, a die is embedded in a molding material. A redistribution structure is formed on a first side of the die and is electrically coupled to the die. The redistribution structure extends beyond lateral extents of the die. Electrically conductive features of the redistribution structure, such as conductive lines or conductive pads, allow electrically connection to the die at locations beyond the boundaries of the die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A-4C, 5A-5C, 6A-6C, 7A-7C, and 8-12 illustrate various views of different embodiment IPDs, in some embodiments.

FIGS. 13A, 13B, 14A, 14B, 15, 16, 17A, and 17B illustrate various embodiment showing the design of and the interaction between the topmost redistribution layer of the InFO package and the topmost metallization layer of the IPD, in some embodiments.

FIG. 24 illustrates a flow chart of a method of fabricating a semiconductor device, in some embodiments.

DETAILED DESCRIPTION

Figure 1:
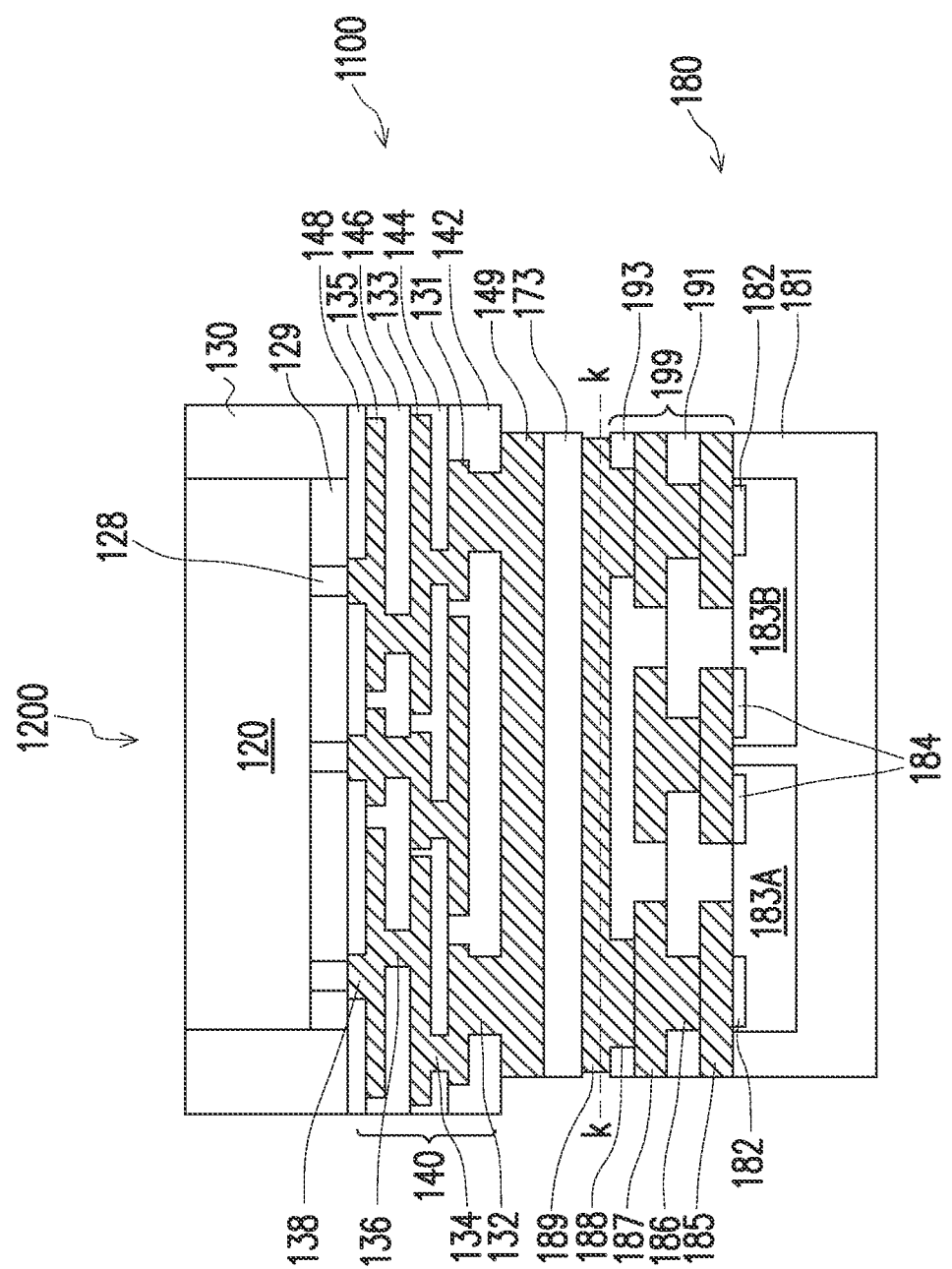
FIG. 1 illustrates a cross-sectional view of a portion of an InFO package with an integrated passive device (IPD) attached, in some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Unless otherwise specified, similar numerals denote the same or similar components.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor packages, and specifically, methods and structures of semiconductor packages comprising an integrated passive device (IPD). In some embodiments, the under bump metallization (UBM) structure of the IPD device comprises strip-shaped conductive patterns or comb-shaped conductive patterns. The strip-shaped conductive patterns, or the fingers of the comb-shaped conductive patterns, are parallel with conductive patterns of a top metallization layer of the IPD, in some embodiments. In some embodiments, the strip-shaped conductive patterns, or the fingers of the comb-shaped conductive patterns, are perpendicular to the conductive patterns of the top metallization layer of the IPD. In some embodiments, the UBM structure of the IPD is bonded to a UBM structure of an integrated fan-out (InFO) package. A topmost redistribution layer of the InFO package has conductive patterns that are parallel with or perpendicular to the conductive patterns of the top metallization layer of the IPD, in some embodiments.

FIG. 1 illustrates a cross-sectional view of a portion of a semiconductor package 1200, which semiconductor package 1200 includes an InFO package 1100 and an IPD 180 attached to the InFO package 1100. As illustrated in FIG. 1, a UBM structure 149 of the InFO package 1100 is bonded to a UBM structure 189 of the IPD 180, e.g., through a solder region 173. Note that the shapes of the various features illustrated in FIG. 1 are for illustration purpose only and not limiting. Other shapes are also possible. For example, the UBM structure 189 of the IPD may not connect the via 188 on the left with the via 188 on the right as illustrated in FIG.

1. As another example, the solder region 173 may not be a continuous region as illustrated in FIG. 1, and may include two or more separate regions of solder. Various embodiments for the UBM structure 189 are discussed hereinafter. These and other variations of the semiconductor package 1200 are fully intended to be included within the scope of the present disclosure.

As illustrated in FIG. 1, the InFO package 1100 comprises a die 120 (also referred to as a semiconductor die, or an integrated circuit (IC) die) embedded in a molding material 130, and a redistribution structure 140 formed on a front side (e.g., the side of the die 120 with die connectors 128) of the die 120. The redistribution structure 140 comprises electrically conductive features, such as conductive lines (e.g., 131/133/135) and vias (e.g., 132/134/136/138), that are formed in one or more dielectric layers (e.g., 142/144/146/148) of the redistribution structure 140. The UBM structure 149 for bonding with an IPD is formed over a topmost dielectric layer (e.g., 142) of the redistribution structure 140 and is electrically coupled to the redistribution structure 140.

The die 120 may include a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures comprising, e.g., metallization patterns in one or more dielectric layers on the semiconductor substrate to form an integrated circuit.

The die 120 further comprises pads, such as aluminum pads, to which external connections are made. The pads are on what may be referred to as active side or front side of the die 120. A passivation film is formed at the front side of the die 120 and on portions of the pads. Openings extend through the passivation film to the pads. Die connectors 128, such as conductive pillars (for example, comprising a metal such as copper), extend into the openings of the passivation film and are mechanically and electrically coupled to the respective pads. The die connectors 128 may be formed by, for example, plating, or the like. The die connectors 128 are electrically coupled to the integrated circuits of the die 120.

A dielectric material 129 is formed on the active sides of the die 120, such as on the passivation film and/or the die connectors 128. The dielectric material 129 laterally encapsulates the die connectors 128, and the dielectric material 129 is laterally coterminous with the die 120. The dielectric material 129 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, CVD, or the like.

Referring to FIG. 1, the molding material 130 around the die 120 may comprise an epoxy, an organic polymer, a polymer with or without a silica-based or glass filler added, or other materials, as examples. The molding material 130 may be formed using any suitable formation method, such as wafer level molding, compressive molding, transfer molding, or the like. Although not illustrated, the molding material 130 may be formed after the die 120 is attached to a first side of a carrier, after which the molding material 130 is formed over the first side of the carrier and around the die 120. In some embodiments, conductive pillars (see, e.g., 119 in FIG. 23) are formed over the first side of the carrier before the molding material 130 is formed.

As illustrated in FIG. 1, the redistribution structure 140 is formed over the die 120 and the molding material 130. In some embodiments, the one or more dielectric layers (e.g., 142, 144, 146, and 148) of the redistribution structure 140 are formed of a polymer, such as PBO, polyimide, BCB, or the like; a nitride such as silicon nitride; an oxide such as silicon oxide, PSG, BSG, BPSG, or the like. The one or more dielectric layers may be formed by a suitable deposition process, such as spin coating, CVD, laminating, the like, or a combination thereof.

In some embodiments, the conductive features of the redistribution structure 140 comprise conductive lines (e.g., 131/133/135) and conductive vias (e.g., 132/134/136/138) formed of a suitable conductive material such as copper, titanium, tungsten, aluminum, or the like. The redistribution structure 140 may be formed by forming a dielectric layer, forming openings in the dielectric layer to expose underlying conductive features, forming a seed layer over the dielectric layer and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. Other methods of forming the redistribution structure 140 are also possible and are fully intended to be included within the scope of the present disclosure.

The number of dielectric layers and the number of layers of the conductive features in the redistribution structures 140 of FIG. 1 are merely non-limiting examples. Other numbers of the dielectric layers and other numbers of layers of the conductive features are also possible and are fully intended to be included within the scope of the present disclosure. The discussion herein may refer to the redistribution layer (RDL) 131 as the topmost RDL of the redistribution structure 140, with the understanding that when other numbers of RDLs are used in the redistribution structure 140, the topmost RDL refers to the RDL furthest from the die 120.

FIG. 1 also illustrates the UBM structure 149 of the InFO package 1100, which UBM structure 149 is formed over and electrically coupled to the redistribution structure 140. To form the UBM structures 149, openings are formed in the topmost dielectric layer (e.g., 142) of the redistribution structure 140 to expose conductive features (e.g., copper lines or copper pads) of the redistribution structure 140. After the openings are formed, the UBM structures 149 may be formed in electrical contact with the exposed conductive features. In an embodiment, the UBM structures 149 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 149. Any suitable materials or layers of material that may be used for the UBM structures 149 are fully intended to be included within the scope of the present disclosure.

The UBM structures 149 may be created by forming each layer over the topmost dielectric layer (e.g., 142) and along the interior of the openings through the topmost dielectric layer to the exposed conductive features of the redistribution structure 140. The forming of each layer may be performed using a plating process, such as electrochemical plating, although other processes of formation, such as sputtering, evaporation, or PECVD process, may alternatively be used depending upon the materials used.

In some embodiments, the UBM structure 149 may have a substantially same (e.g., within manufacturing error margin) shape and/or a substantially same size as the UBM structure 189 of the IPD 180. For example, in a plan view, boundaries of the UBM structure 149 of the InFO package 1100 may overlap completely with boundaries of the UBM structure 189 of the IPD 180. Therefore, in the discussions hereinafter, unless otherwise specified, it is assumed that the shape and/or the size of the UBM structure 149 match those of the UBM structure 189.

Still referring to FIG. 1, the IPD 180 comprises a substrate 181 and a plurality of passive devices 183 (e.g., 183A and 183B), such as capacitors or inductors, formed in/on the substrate 181. An interconnect structure 199, which includes dielectric layers (e.g., 191/193) and metallization layers (e.g., 185, 187) formed in the dielectric layers. In addition, the interconnect structure 199 also includes vias (e.g., 186/188) formed in the dielectric layers 191/193. A UBM structure 189 is formed over the topmost dielectric layer (e.g., 193) of the IPD 180. The UBM structure 189 is electrically coupled to the passive devices 183 through the interconnect structure 199. As illustrated in FIG. 1, the UBM structure 189 is bonded to the UBM structure 149 by, e.g., solder regions 173. In other embodiments, the UBM structure 189 is directly bonded to the UBM structure 149 by, e.g., a direct bonding process, thus no solder region is formed between the UBM structure 189 and the UBM structure 149.

The substrate 181 of the IPD 180 may be a same or similar semiconductor substrate as the substrate of the die 120, thus details are not repeated. The passive devices 183 are formed in/on the substrate 181. Each of the passive devices 183 has pads 182/184, such as copper pads or aluminum pads, that are used for electrically coupling the passive devices 183 to electrical circuits external to the passive devices 183. In some embodiments, one of the pads (e.g., pad 182, which may be referred to as power pad), is configured to be electrically coupled to a power supply, e.g., a 5V voltage supply, a 3V voltage supply, a 1.3V voltage supply, or the like; and another pad (e.g., pad 184, which may be referred to as ground pad) is configured to be electrically coupled to a reference voltage, such as the electrical ground. The formation of the interconnect structure 199 may use any suitable method, such as the method known and used for forming the interconnect structure of the die 120.

In some embodiments, the passive devices 183 are capacitors, and the interconnect structure 199 electrically couples two or more of the passive devices 183 together by, e.g., parallel connecting the passive devices 183. For example, the ground pads 184 are electrically coupled together by the metallization layer 185. The power pads 182 are electrically coupled together by, e.g., the metallization layer 185/187, vias 186/188, and the UBM structure 189. One skilled in the art will appreciate that the equivalent capacitance of N parallel connected capacitors, each having a capacitance of C, is N*C. Therefore, by parallel connecting the plurality of capacitors 183, the IPD 180 is able to provide a much larger equivalent capacitance (e.g., 0.001 µF to 100 µF) to an external circuit or an external device (e.g., the InFO package 1100).

As illustrated in FIG. 1, the metallization layer 185 (e.g., conductive lines) is formed over and electrically coupled with the passive devices 183. The metallization layer 187 is formed over the dielectric layer 191, and the UBM structure 189 is formed over the topmost dielectric layer (e.g., 193) of the interconnect structure 199. Vias 186 are formed between and electrically couple the metallization layers 185 and 187, and vias 188 are formed between and electrically couple the metallization layer 187 and the UBM structure 189. Note that not all of the features of the IPD 180 are visible in the cross-sectional view of FIG. 1. In addition, the UBM structure 189 and the electrical connections illustrated in FIG. 1 are for illustration purpose and not limiting. As discussed hereinafter, various designs of the UBM structure 189 and various electrical connections between the UBM structure 189 and the interconnect structure 199 are possible. These and other modifications are fully intended to be included within the scope of the present disclosure.

The interconnect structure 199 in FIG. 1 has two dielectric layers 191/193 and two metallization layers 185/187 for illustration purpose. Other numbers of dielectric layers, other numbers of metallization layers, and other numbers of layers of vias are also possible and are fully intended to be included within the scope of the present disclosure. The discussion herein may refer to the metallization layer 187 as the topmost metallization layer (e.g., furthest from the substrate 181) of the interconnect structure 199, and may refer to the dielectric layer 193 as the topmost dielectric layer of the interconnect structure 199, with the understanding that when other numbers of dielectric layers and other numbers of metallization layers are used in the interconnect structure 199, the topmost metallization layer and the topmost dielectric layer refer to the metallization layer and the dielectric layer of the interconnect structure 199 that are furthest from the substrate 181, respectively.

FIGS. 2, 3, 4A-4C, 5A-5C, 6A-6C, 7A-7C, and 8-12 illustrates various views (e.g., plan views, cross-sectional views) showing the design of the UBM structure 189 of different embodiment IPDs. For clarity, not all features of the IPDs are illustrated in the figures.

Figure 2:
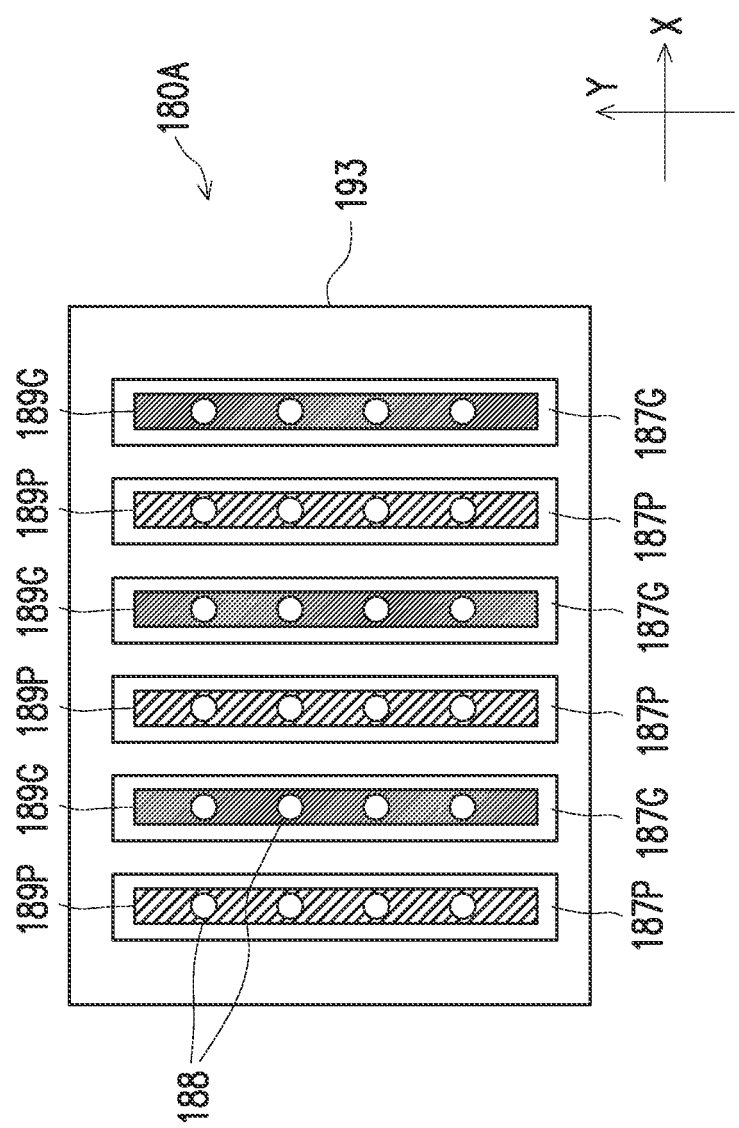

FIG. 2 illustrates a plan view of an IPD 180A, in accordance with an embodiment. Note that for clarity, not all layers of the IPD 180A are illustrated in the plan view of FIG. 2. Similarly, not all layers of each of the various embodiment IPDs (e.g., 180B-180F) discussed hereinafter are illustrated in the respective plan view (e.g., FIGS. 3, 4A, 5A, 6A and 7A). In the example of FIG. 2, the topmost metallization layer 187 of the IPD 180A comprises a plurality of conductive patterns (e.g., metal patterns) 187P and 187G. Specifically, the conductive patterns 187P/187G comprise a plurality of electrically conductive features (e.g., conductive lines, metal lines, metal strips) that are parallel to each other. For example, the longitudinal axes (e.g., along the Y-direction of FIG. 2) of the plurality of conductive patterns 187P/187G are parallel to each other, and the conductive patterns 187P/187G may be evenly spaced from one another, as illustrated in FIG. 2. In addition, the conductive patterns 187P (or 187G) are electrically coupled to a same voltage level. For example, the conductive patterns 187P are electrically coupled to the power pad 182 by the interconnect structure 199 (see, e.g., FIG. 1), and therefore, have a same voltage as the power pad 182. Similarly, the conductive patterns 187G are electrically coupled to the ground pad 184 by the interconnect structure 199 (see, e.g., FIG. 1), and therefore, have a same voltage as the ground pad 184. Therefore, the conductive patterns 187P may be referred to as power patterns 187P, and the conductive patterns 187G may be referred to as ground patterns 187G. Furthermore, the conductive patterns 187P are interleaved with the conductive patterns 187G. In other words, the power patterns 187P and the ground patterns 187G are disposed alternately over the topmost dielectric layer 193. In some embodiments, the conductive patterns 187P/187G have a same or similar shape and/or a same or similar size.

In FIG. 2, the UBM structure 189 of the IPD 180A comprises a plurality of conductive patterns (e.g., conductive lines, metal lines, metal strips) 189P and 189G. The plurality of conductive patterns 189P/189G are parallel to each other, in the illustrated embodiment. The conductive patterns 189P/189G may be evenly spaced from one another. In some embodiments, the conductive patterns 189P/189G have a same or similar shape and/or a same or similar size. As illustrated in FIG. 2, there is a one-to-one correspondence between the conductive patterns 189P and the conductive patterns 187P, and a one-to-one correspondence between the conductive patterns 189G and the conductive patterns 187G. In other words, each of the conductive patterns 189P is electrically coupled to a respective one of the conductive patterns 187P by vias 188, and each of the conductive patterns 189G is electrically coupled to a respective one of the conductive patterns 187G by vias 188.

As illustrated in FIG. 2, the conductive patterns 189P/189G are parallel to the conductive patterns 187P/187G. Although the conductive patterns 189P/189G are illustrated to have a width (e.g., measured along the X-direction) smaller than a width (e.g., measured along the X-direction) of the conductive patterns 187P/187G in FIG. 2, the conductive patterns 189P/189G may have a same width as or a larger width than the conductive patterns 187P/187G. Similarly, although a length (e.g., measured along the Y-direction) of the conductive patterns 189P/189G is smaller than a length of the conductive patterns 187P/187G in FIG. 2, these are for illustration purpose and not limiting. The conductive patterns 189P/189G may have a same length as or a larger length than the conductive patterns 187P/187G. In addition, the shape of the vias 188 in FIG. 2 is illustrated as a round shape. Other suitable shapes, such as oval, rectangle (see, e.g., 188 in FIG. 3), line-shape (see, e.g., 188 in FIG. 4), a group of rectangles (see, e.g., 188 in FIG. 5A), the like, or combinations thereof, may also be used and are fully intended to be included within the scope of the present disclosure.

Figure 3:
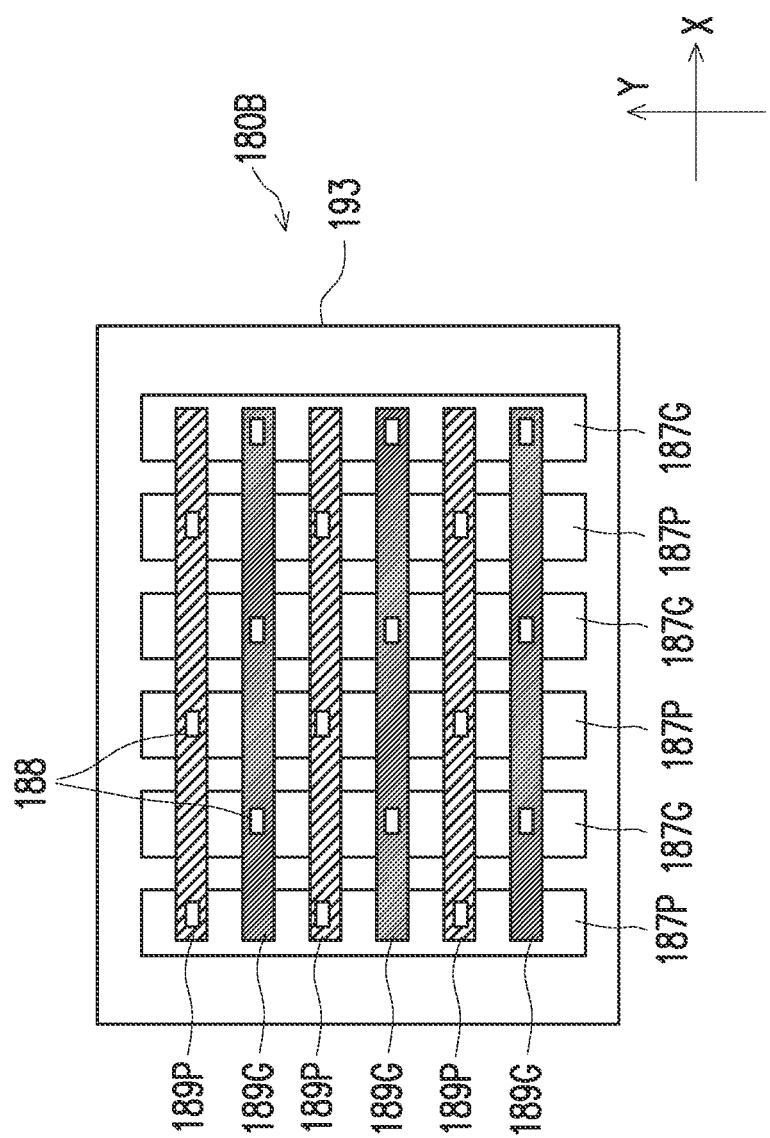

FIG. 3 illustrates a plan view of an IPD 180B, in accordance with an embodiment. The IPD 180B in FIG. 3 is similar to the IPD 180A in FIG. 2, but with some modifications. For example, the conductive patterns 189P/189G of the UBM structure 189 are perpendicular to the conductive patterns 187P/187G of the topmost metallization layer 187. In addition, locations of the vias 188 are chosen to connect a conductive pattern 189P with a corresponding conductive pattern 187P, and to connect a conductive pattern 189G with a corresponding conductive patterns 187G.

Still referring to FIG. 3, the width (e.g., measured along the Y-direction of FIG. 3) and/or the length (e.g., measured along the X-direction of FIG. 3) of the conductive patterns 189P/189G may be smaller than, the same as, or larger than those of the conductive patterns 187P/187G. The shape of the vias 188 in FIG. 3 are rectangular, however, other suitable shape, such as circle, oval, line-shape, a ground of closely spaced via, or the like, may also be used.

Figure 4A:
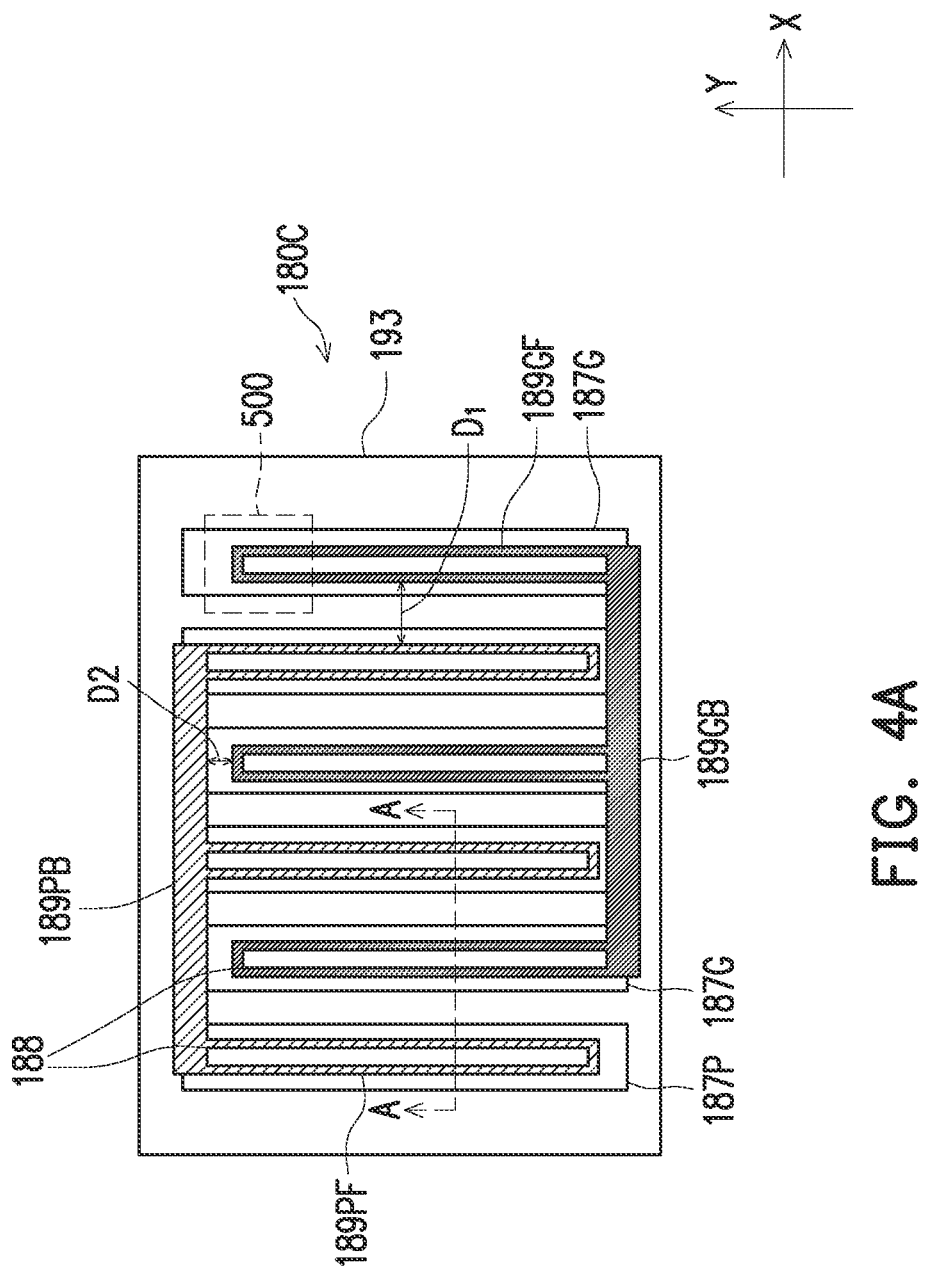
Figure 4C:
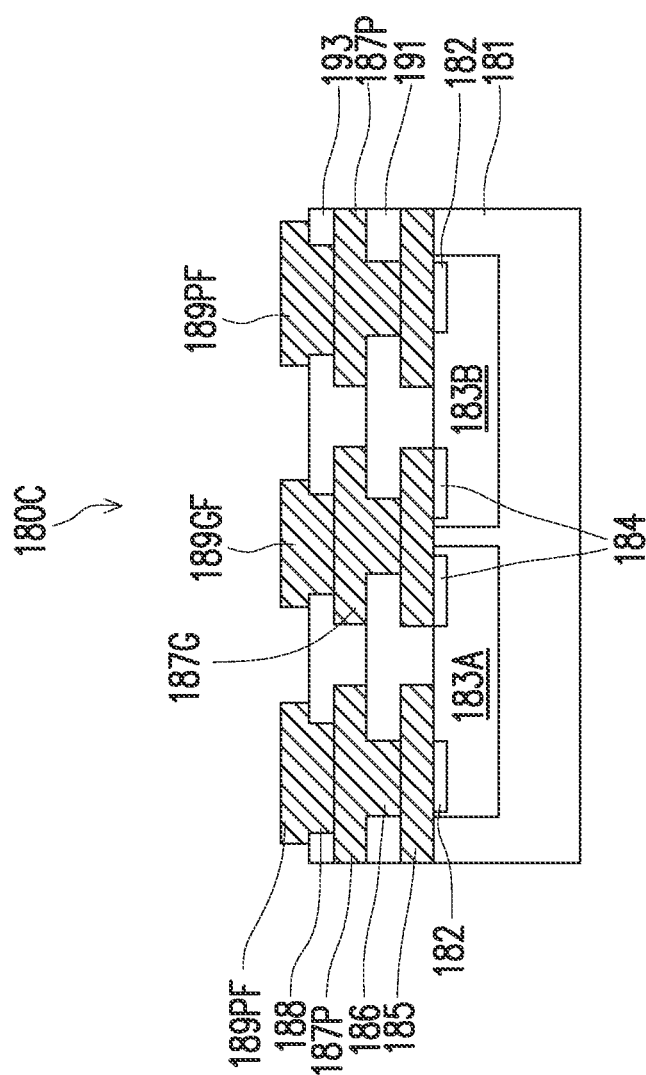
Figure 4B:
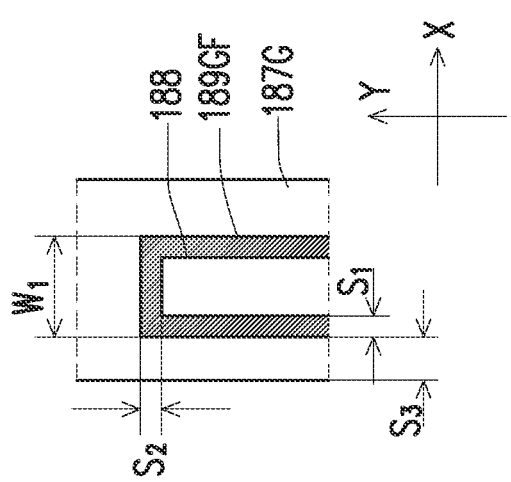

FIG. 4A illustrates a plan view of an IPD 180C, in accordance with an embodiment. FIG. 4B shows a zoomed-in view of an area 500 of FIG. 4A, and FIG. 4C illustrates a cross-sectional view of the IPD 180C along cross-section A-A of FIG. 4A.

In FIG. 4A, the topmost metallization layer 187 of the IPD 180C has a plurality of conductive patterns 187P/187G that are the same or similar to the conductive patterns 187P/187G of FIG. 2. The UBM structure 189 of the IPD 180C, however, comprises two comb-shaped conductive patterns. One of the comb-shaped conductive patterns has a base 189PB, and a plurality of fingers 189PF physically connected to the base 189PB. The fingers 189PF are parallel to each other, and the base 189PB is substantially perpendicular to the fingers 189PF, as illustrated in FIG. 4A. The fingers 189PF are parallel to the conductive patterns 187P, and have a one-to-one correspondence with the conductive patterns 187P, in the illustrated example. The vias 188 electrically couple each of the fingers 189PF to a respective one of the conductive patterns 187P. In the example of FIG. 4A, the via 188 has a line-shape, e.g., having a large length (measured along the Y-direction of FIG. 4A) to width (measured along the X-direction of FIG. 4A) ratio, such as in a range between 2 and 50. As illustrated in FIG. 4A, each of the line-shaped vias 188 overlaps with a high percentage (e.g., between about 50% and about 99%) of the area of a corresponding finger 189PF. The large cross-sectional area of the line-shaped vias 188 may advantageously reduce the electrical resistance of the IPD formed.

Another comb-shaped conductive pattern has a base 189GB, and a plurality of fingers 189GF physically connected to the base 189GB. The fingers 189GF are parallel to each other, and the base 189GB is substantially perpendicular to the fingers 189GF, as illustrated in FIG. 4A. The fingers 189GF are parallel to the conductive patterns 187G, and have a one-to-one correspondence with the conductive patterns 187G, in the illustrated example. The vias 188 electrically couple each of the fingers 189GF to a respective one of the conductive patterns 187G.

As illustrated in FIG. 4A, the fingers 189PF are interleaved with the fingers 189GF. In some embodiments, the fingers 189PF and the fingers 189GF are evenly spaced from one another, and all the fingers 189PF/189GF may have a same or similar size. A distance $D_1$ between adjacent fingers 189PF and 189GF may be in a range between about 5 μm and about 50 μm, in some embodiments. In addition, a distance $D_2$ between an end of a finger (e.g., 189GF) of a comb-shaped conductive pattern and a base (e.g., 189PB) of another comb-shaped conductive pattern may be in a range between about 5 μm and about 50 μm, in some embodiments.

FIG. 4B illustrates the zoomed-in view of the area 500 of FIG. 4A. As illustrated in FIG. 4B, a width $W_1$ of a finger (e.g., 189GF) may be in a range between about 5 μm and about 50 μm. A distance $S_1$ between a side of the via 188 and a corresponding side of a finger (e.g., 189GF) may be in a range between about 2 μm and about 20 μm, and a distance $S_2$ between an end of the via 188 and a corresponding end of the finger (e.g., 189GF) may be in a range between about 2 μm and about 20 μm. Furthermore, a distance $S_3$ between a side of the finger (e.g., 189GF) and a corresponding side of the conductive pattern (e.g., 187G) may be in a range between about 2 μm and about 20 μm.

FIG. 4C illustrates a cross-sectional view of a portion of the IPD 180C. As illustrated in FIG. 4C, the conductive patterns 187G of the top metallization layer 187 and the fingers 189GF of the UBM structure 189 are electrically coupled to the ground pads 184; and the conductive patterns 187P of the top metallization layer 187 and the fingers 189PF of the UBM structure 189 are electrically coupled to the power pads 182.

Figure 5A:
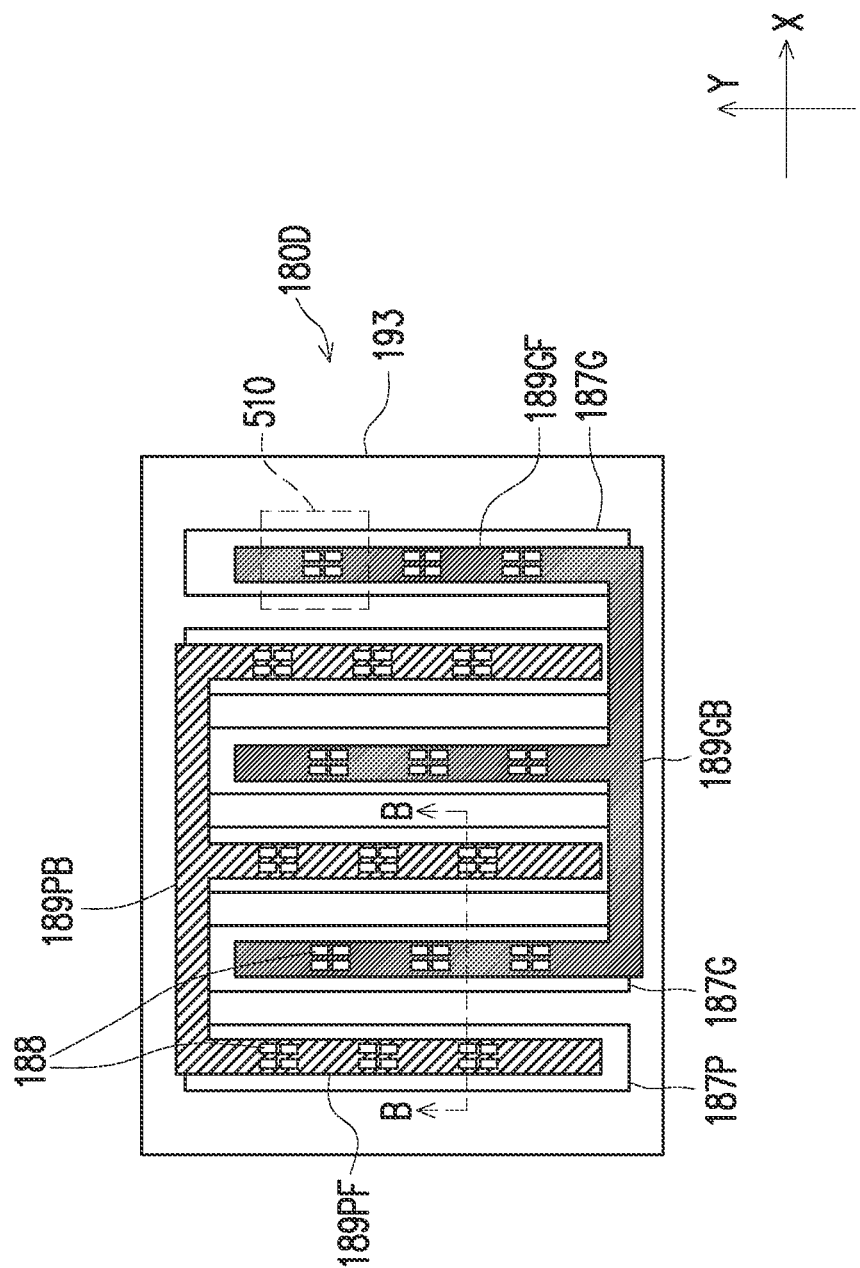

FIG. 5A illustrates a plan view of an IPD 180D, in accordance with an embodiment. FIG. 5B shows a zoomed-in view of an area 510 of FIG. 5A, and FIG. 5C illustrates a cross-sectional view of the IPD 180D of FIG. 5A along cross-section B-B.

The IPD 180D is similar to the IPD 180C in FIG. 4A, but with different shapes for the vias 188. In particular, each of the fingers (e.g., 189PF) of a comb-shaped conductive pattern is electrically coupled to a respective conductive pattern (e.g., 187P) of the topmost metallization layer 187 by a plurality of vias 188, where each of the vias 188 further comprises a group of closely spaced vias, e.g., 188A/188B/188C/188D as illustrated in FIG. 5B.

In the zoomed-in view of FIG. 5B, each via 188 includes a group of four closely spaced rectangular shaped vias 188A/188B/188C/188D. The four vias in a same group may have a same size. A width $T_1$ of each of the four vias may be in a range between about 2 μm and about 10 μm, and a width $T_2$ of each of the four vias may be in a range between about 2 μm and about 10 μm. A distance $S_4$ between adjacent vias in a group, measured along the Y-direction of FIG. 5B, may be in a range between about 2 μm and about 10 μm, and a distance $S_5$ between adjacent vias in a group, measured along the X-direction of FIG. 5B, may be in a range between about 2 μm and about 10 μm. In addition, a width $W_2$ of the finger (e.g., 189GF) may be in a range between about 5 μm and about 50 μm. Furthermore, a distance $S_6$ between an exterior side of the via 188 and a corresponding side of the finger (e.g., 189GF), measured along the X-direction of FIG. 5B, may be in a range between about 2 μm and about 10 μm. A distance $S_7$ between a side of the finger (e.g., 189GF) and a corresponding side of the conductive pattern (e.g., 187G), measured along the X-direction of FIG. 5B, may be in a range between about 2 μm and about 20 μm. In some embodiments, a distance between two adjacent vias 188 (each including a group of closely spaced vias) disposed on a same finger (e.g., 189PF, or 189GF) is between about 2 μm and about 100 μm, where the distance is measured between the center of each via 188 along the Y-direction of FIG. 5A.

Figure 5C:
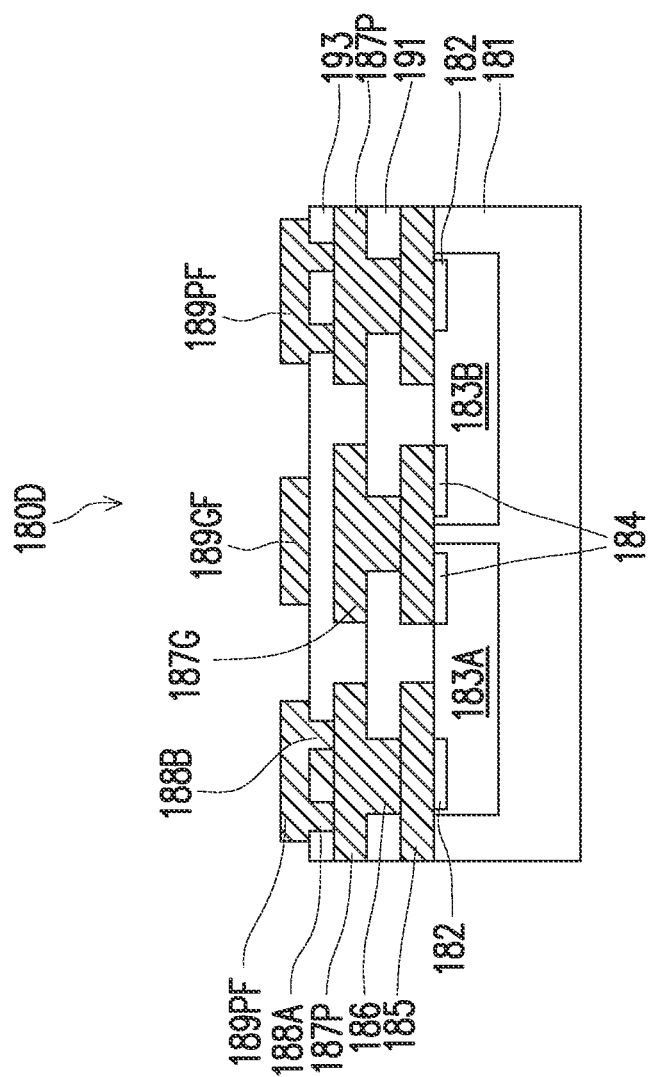
Figure 5B:
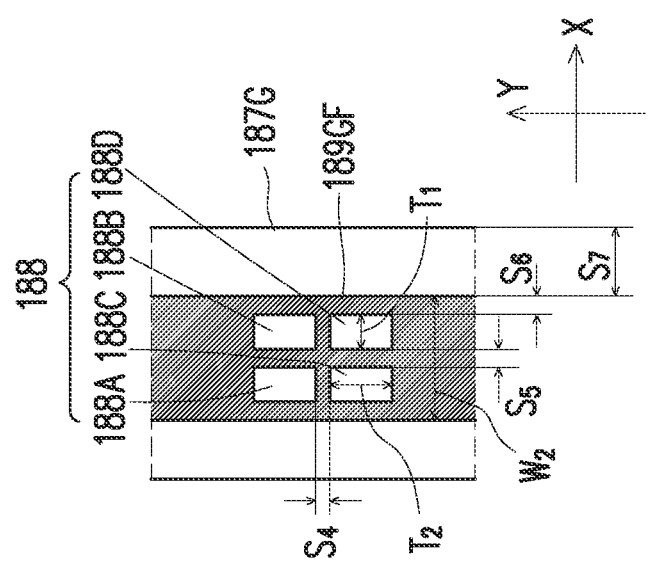

FIG. 5C illustrates a cross-sectional view of a portion of the IPD 180D. As illustrated in FIG. 5C, the conductive patterns 187P of the top metallization layer 187 and the fingers 189PF of the UBM structure 189 are electrically coupled to the power pads 182. FIG. 5C also shows the vias 188A and 188B in a same group that are cut by the cross-section B-B as illustrated in FIG. 5A. Although not visible in the cross-section B-B, the finger 189GF of the UBM structure 189 is electrically coupled to the conductive pattern 187G of the top metallization layer 187 through another via 188, which conductive pattern 187G is in turn electrically coupled to the ground pads 184 through the via 186.

Figure 6A:
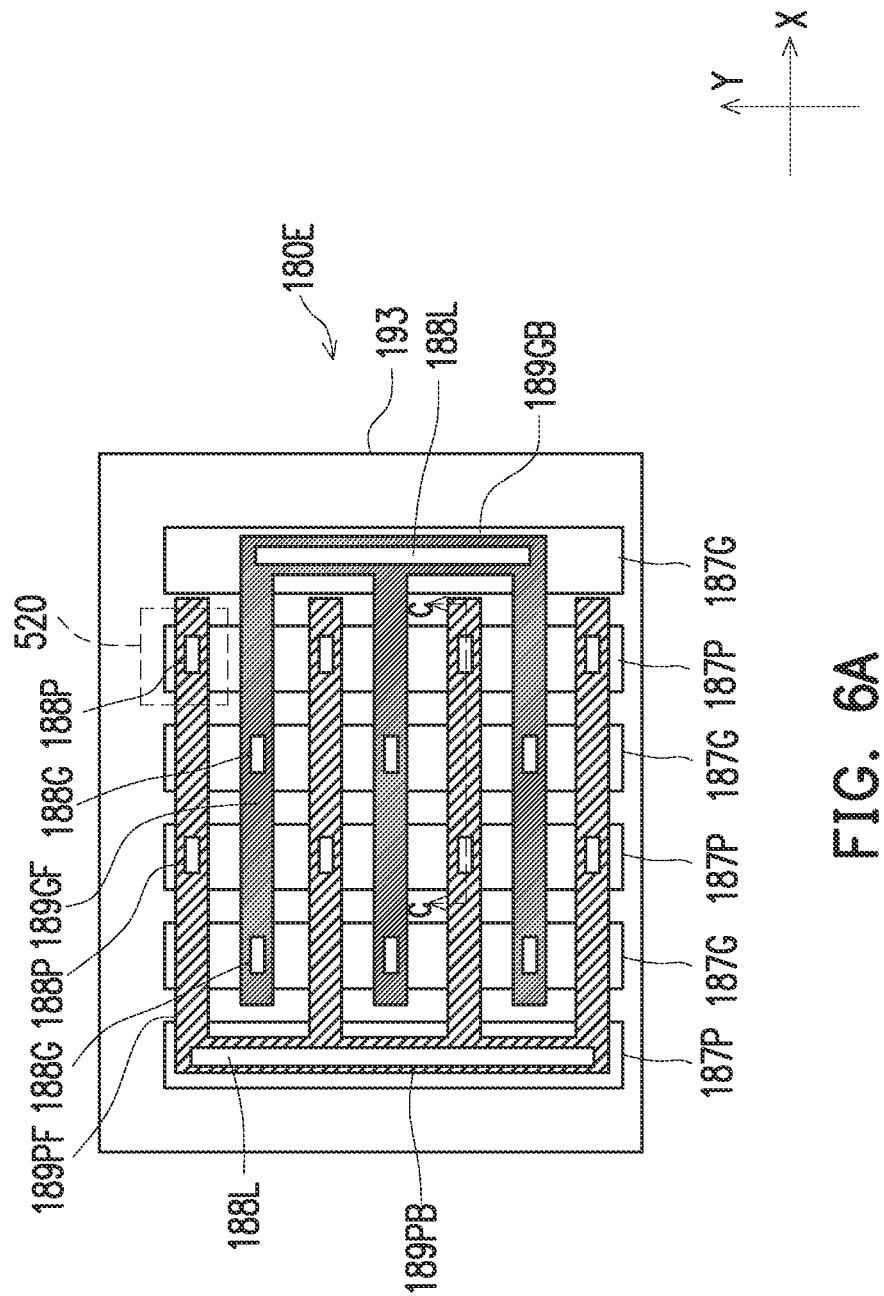
Figure 6C:
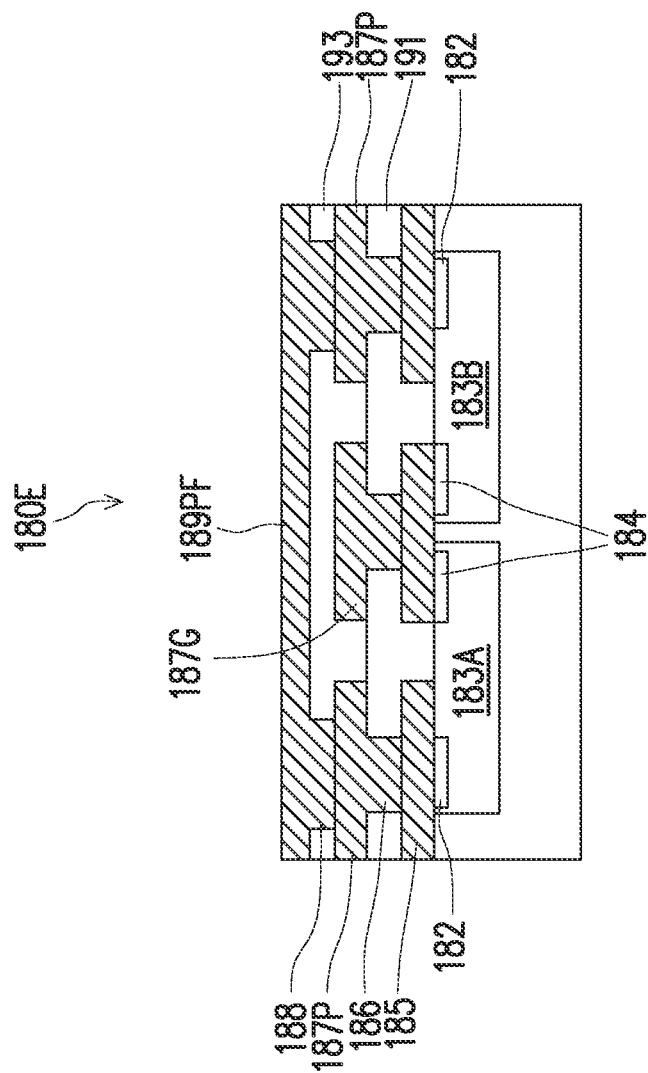
Figure 6B:
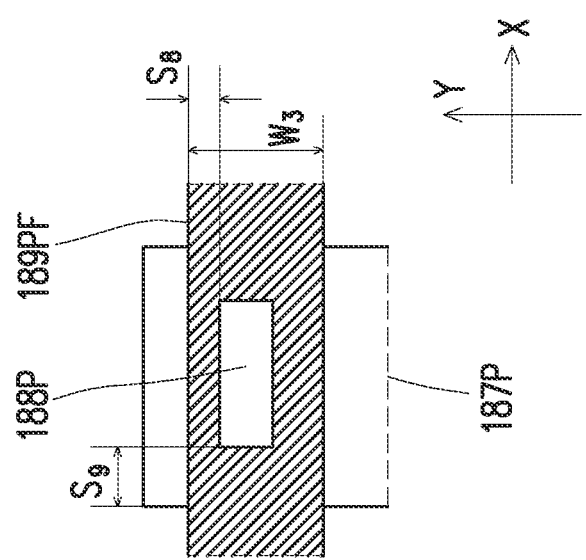

FIG. 6A illustrates a plan view of an IPD 180E, in accordance with an embodiment. FIG. 6B shows a zoomed-in view of an area 520 of FIG. 6A, and FIG. 6C illustrates a cross-sectional view of the IPD 180E of FIG. 6A along cross-section C-C.

In FIG. 6A, the topmost metallization layer 187 of the IPD 180E has a plurality of conductive patterns 187P/187G that are the same or similar to the conductive patterns 187P/187G of FIG. 4A. The UBM structure 189 of the IPD 180E, however, comprises two comb-shaped conductive patterns that are rotated 90 degrees with respect to the UBM structure 189 of FIG. 4A. In particular, the base (e.g., 189PB and 189GB) of the comb-shaped conductive patterns are parallel with the conductive patterns 187P/187G of the topmost metallization layer 187, and the fingers (e.g., 189PF and 189GF) of the comb-shaped conductive patterns are perpendicular to the conductive patterns 187P/187G of the topmost metallization layer 187.

Referring to FIG. 6A, the base (e.g., 189PB or 189GB) of each of the comb-shaped conductive patterns is electrically coupled to a respective conductive pattern (e.g., 187P or 187G) through a line-shaped via 188L. In some embodiments, the line-shaped vias 188L overlaps with a high percentage (e.g., between about 50% and about 99%) of the area of a corresponding base (e.g., 189PB or 189GB). The large cross-sectional area of the line-shaped vias 188L may advantageously reduce the electrical resistance of the IPD formed. Rectangular shaped vias 188G are formed over (e.g., directly over) the conductive patterns 187G (e.g., along a longitudinal direction of each of the conductive patterns 187G) and electrically connect the fingers 189GF with the conductive patterns 187G. Similarly, rectangular shaped vias 188P are formed over (e.g., directly over) the conductive patterns 187P (e.g., along a longitudinal direction of each of the conductive patterns 187P) and electrically connect the fingers 189PF with the conductive patters 187P.

FIG. 6B illustrates a zoomed-in view of the area 520 in FIG. 6A. In FIG. 6B, a width $W_3$ of the finger (e.g., 189PF) may be in a range between about 5 μm and about 50 μm. A distance $S_8$ between a side of the rectangular shaped via 188P and a corresponding side of the finger (e.g., 189PF) may be in a range between about 2 μm and about 10 μm. A distance $S_9$ between another side of the rectangular shaped via 188P and a corresponding side of the conductive pattern (e.g., 187P) may be in a range between about 2 μm and about 10 μm.

FIG. 6C illustrates a cross-sectional view of a portion of the IPD 180E. As illustrated in FIG. 6C, the conductive patterns 187P of the top metallization layer 187 and the fingers 189PF of the UBM structure 189 are electrically coupled to the power pads 182. Although not visible in the cross-section C-C, the finger 189GF of the UBM structure 189 is electrically coupled to the conductive pattern 187G of the top metallization layer 187 through another via 188, which conductive pattern 187G is in turn electrically coupled to the ground pads 184 through the via 186.

Figure 7A:
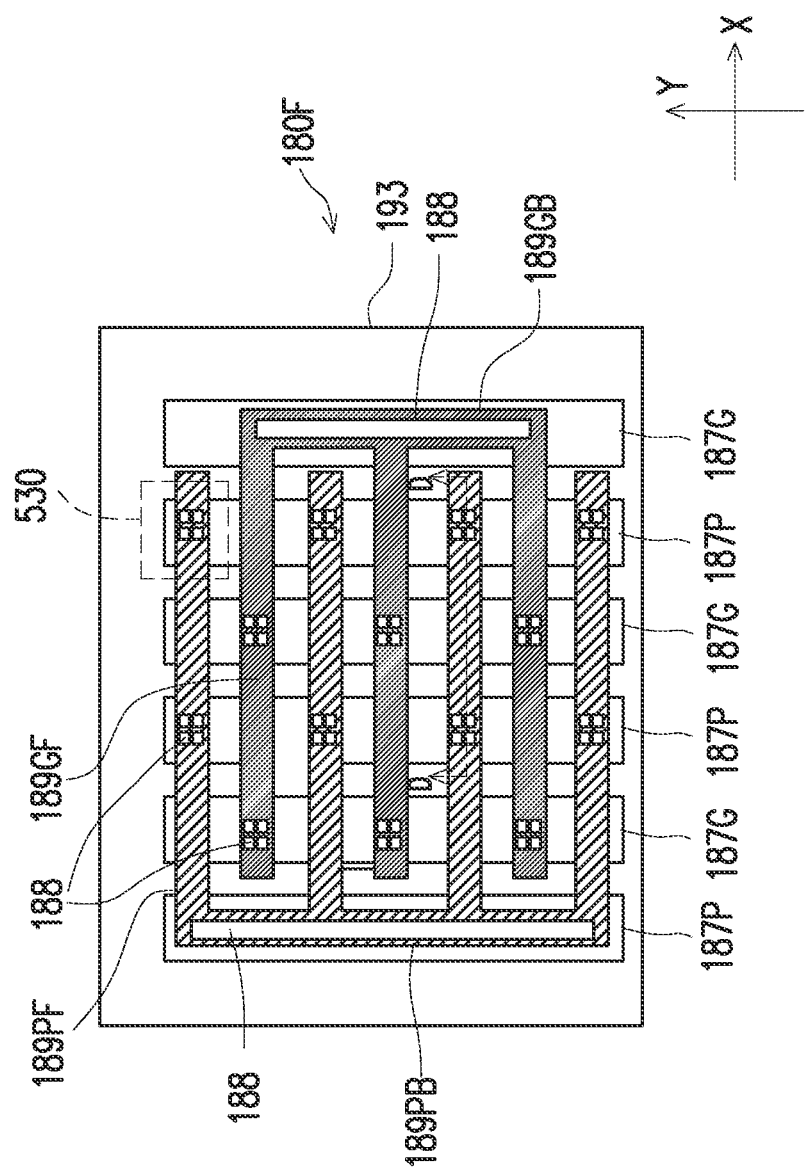

FIG. 7A illustrates a plan view of an IPD 180F, in accordance with an embodiment. FIG. 7B shows a zoomed-in view of an area 530 of FIG. 7A, and FIG. 7C illustrates a cross-sectional view of the IPD 180F of FIG. 7A along cross-section D-D.

Referring to FIG. 7A, the conductive patterns 187P/187G of the IPD 180F and the comb-shaped conductive patterns (e.g., 189PB/189PF and 189GB/189GF) are the same or similar to those of the IPD 180E in FIG. 6A. Compared with FIG. 6A, each of the rectangular shaped vias 188P/188G in FIG. 6A have been replaced with a group of closely spaced vias (see 188A/188B/188C/188D in FIG. 7B). The size of the closely spaced vias and the spacing between the closely spaced vias may be the same or similar to those illustrated in FIG. 5B, details are not repeated.

Referring now to FIG. 7B, a width $W_4$ of the finger (e.g., 189PF) may be in a range between about 5 μm and about 50 μm. A distance $S_{10}$ between an exterior side of the group of closely spaced vias 188 and a corresponding side of the finger (e.g., 189PF) may be in a range between about 2 μm and about 10 μm. A distance $S_{11}$ between a side of the finger (e.g., 189PF) and a corresponding side of the conductive pattern (e.g., 187P) may be in a range between about 2 μm and about 10 μm.

Figure 7C:
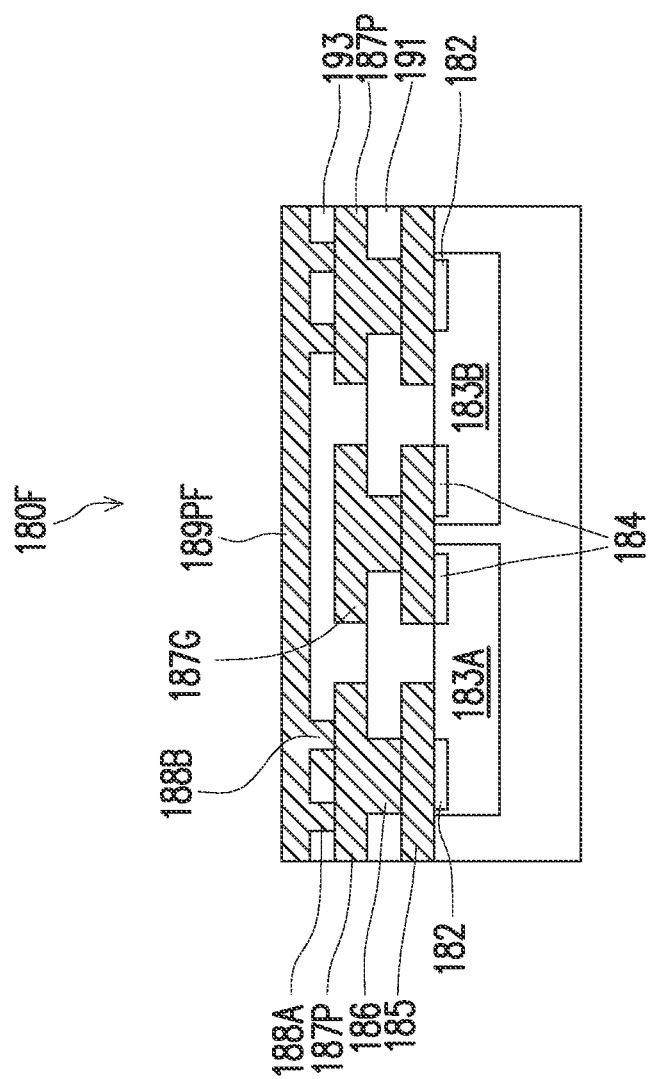
Figure 7B:
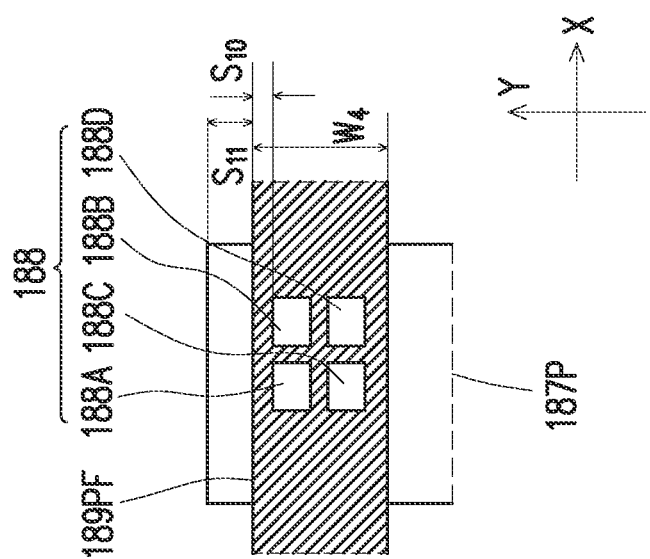

FIG. 7C illustrates a cross-sectional view of a portion of the IPD 180F. As illustrated in FIG. 7C, the conductive patterns 187P of the top metallization layer 187 and the finger 189PF of the UBM structure 189 are electrically coupled to the power pads 182. FIG. 7C also shows the vias 188A and 188B in a same group of vias that are cut by the cross-section D-D. Although not visible in the cross-section D-D, the finger 189GF of the UBM structure 189 is electrically coupled to the conductive pattern 187G of the top metallization layer 187 through another via 188, which conductive pattern 187G is in turn electrically coupled to the ground pads 184 through the via 186.

The various embodiment designs of the UBM structure 189 improve the performance of the IPD. For example, the strip-shaped UBM structures (see, e.g., FIGS. 2 and 3) and the comb-shaped UBM structures (see, e.g., FIGS. 4A, 5A, 6A and 7A) provide high coverage ratio which allows for high density vias (e.g., 188) to be formed between the UBM structures and the conductive patterns 187P/187G of the topmost metallization layer 187 of the IPD, thus reducing the equivalent series resistance (ESR) of the IPD formed. In some embodiment, the coverage ratio (e.g., a ratio between a sum of the areas of the UBM structures 189 and a sum of the areas of the conductive patterns 187) is between about 0.1 and about 0.99, and a density of vias (e.g., a ratio between a sum of the areas of the vias 188 and a sum of the areas of the UBM structures 189) is between about 0.1 and about 0.99. In addition, the interleaved power/ground patterns, provided by the interleaved conductive patterns 189P/189G of the strip-shaped UBM structure, or by the interleaved fingers 189PF/189GF of the comb-shaped UBM structure, shunt the electrical current paths (e.g., paths through the conductive patterns 189P/189G, vias 188, and the conductive patterns 187P/187G), thus reducing the equivalent series inductance (ESL) of the IPD formed.

Additional embodiments of the UBM structure design are illustrated in FIGS. 8-12. In particular, FIGS. 8-12 each illustrates a plan view of an embodiment design for the UBM structure 189 of the IPD 180. In each of the FIGS. 8-12, the top metallization layer 187 of the IPD has interleaved conductive patterns 187P/187G, where the conductive patterns 187P are configured to be electrically coupled to a power supply voltage, and the conductive patterns 187G are configured to be electrically coupled to a reference voltage (e.g., electrical ground).

Figure 8:
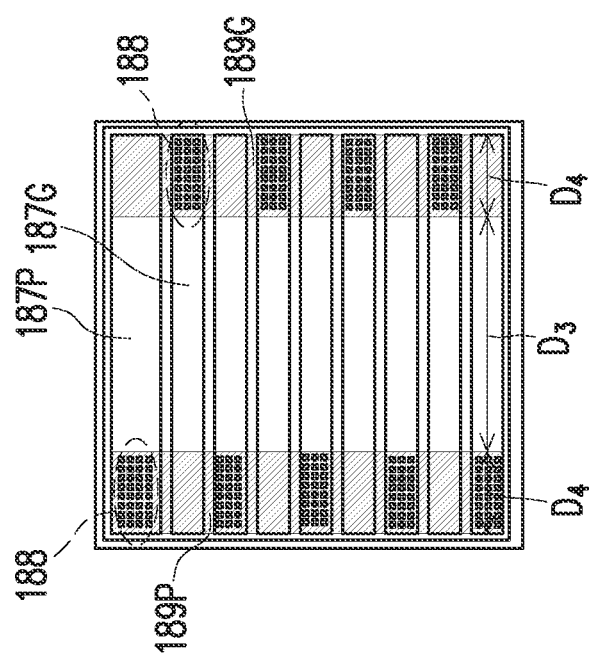

In FIG. 8, the UBM structure 189 has a conductive pattern 189P and a conductive pattern 189G, which are electrically coupled to the conductive pattern 187P and the conductive pattern 187G, respectively, by vias 188. Each of the vias 188 in FIG. 8 comprises an array of closely spaced vias. A width $D_4$ of the conductive patterns 189G/189P is smaller than a distance $D_3$ between the conductive patterns 189G and 189P, as illustrated in FIG. 8.

Figure 9:
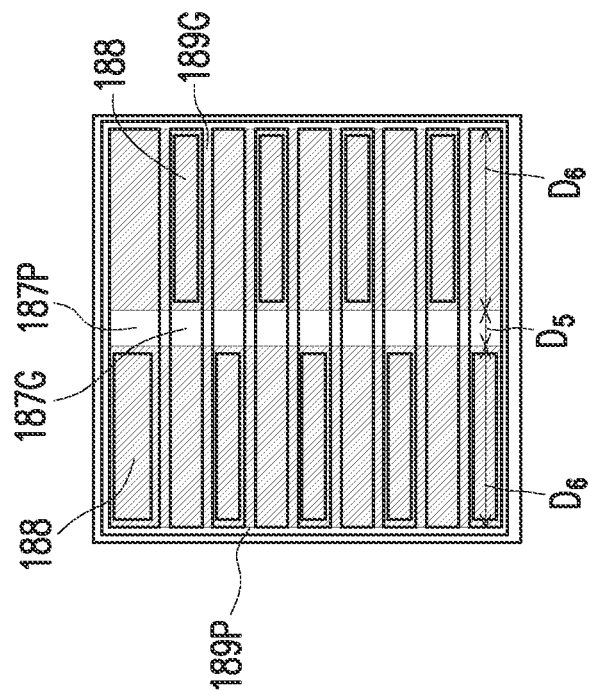

In FIG. 9, the UBM structure 189 has a conductive pattern 189P and a conductive pattern 189G, which are electrically coupled to the conductive pattern 187P and the conductive pattern 187G, respectively, by vias 188. Each of the vias 188 in FIG. 9 has a width (measured along the direction of $D_6$) between about 50% and 99% of a width $D_6$ of the conductive patterns 189P/189G, in some embodiments. The width $D_6$ of the conductive patterns 189G/189P is larger than a distance $D_5$ between the conductive patterns 189G and 189P, as illustrated in FIG. 9.

FIG. 10 illustrates an UBM structure having comb-shaped conductive patterns with fingers 189PF/189GF that are perpendicular to the underlying conductive patterns 187P/187G of the top metallization layer. Compared with the UBM structure 180E of FIG. 6A, one of the comb-shaped conductive patterns in FIG. 10 has a finger (e.g., the rightmost finger 189GF) that is wider than the other two fingers (e.g., the fingers 189GF on the left and in the middle) connected to the base 189GB. In addition, each of the bases (e.g., 189GB, 189PB) has an end portion 188E that extends beyond boundaries of the fingers connected to it.

FIG. 11 illustrates an UBM structure having comb-shaped conductive patterns with fingers 189PF/189GF that are parallel with the underlying conductive patterns 187P/187G of the top metallization layer. In FIG. 11, line-shaped vias 188 substantially overlap (e.g., overlap between 50% and about 99%) the corresponding underlying conductive pattern 187G/187P. In addition, the line-shaped vias 188 extend into the bases (e.g., 189GB, 189PB) area and overlap with portions of the bases. In some embodiments, the outmost fingers (e.g., the topmost finger 189PF in FIG. 11 and the lowermost finger 189GF in FIG. 11) are wider than the inner fingers (e.g., fingers 189PF and fingers 189GF) between the outmost fingers.

Figure 12:
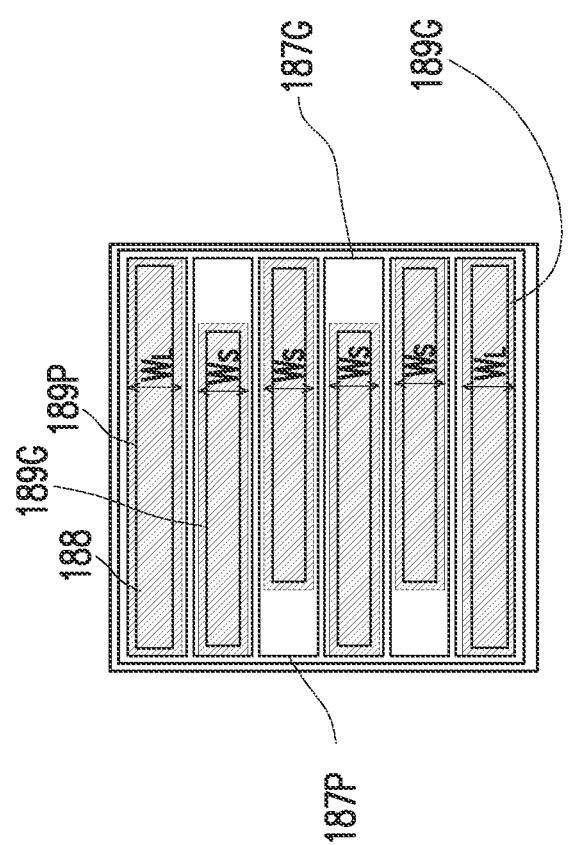

FIG. 12 illustrates an UBM structure having interleaved strip-shaped conductive patterns 189P and 189F that are parallel with the underlying conductive patterns 187P/187G of the top metallization layer. In the example of FIG. 12, the topmost conductive pattern 189P and the bottommost conductive pattern 189G have a width $W_L$ that is larger than a width $W_S$ of the conductive patterns 189P/189G disposed therebetween. In some embodiments, the width $W_L$ is between about 5 μm and about 50 μm, and the width $W_S$ is between about 5 μm and about 50 μm.

Simulations were performed to analyze the performance of the different embodiment designs illustrated in FIGS. 8-12. The ESR and ESL of the IPD 180 having the UBM structures of FIGS. 8-12 were simulated at a frequency of 100 MHz. In the simulations, it is assumed that ESR and ESL increase with the thickness of the UBM structure. Layers of the IPD 180 from the topmost metallization layer 187 to the UBM structure 189 were simulated in the simulations. The UBM structure of FIG. 8 may be used as a baseline design to compare with other designs for the UBM structure. The simulations show that with a thickness of 18 μm, the UBM structure of FIG. 8 has an ESR of 0.38 mΩ and an ESL of 1.40 pH. The UBM structure of FIG. 9 has an ESR of 0.06 mΩ and an ESL of 0.81 pH with a thickness of 18 μm; with a thickness of 35 μm, the UBM structure of FIG. 9 has an ESR of 0.10 mΩ and an ESL of 2.08 pH. Simulations for the UBM structures of FIGS. 10-12 were performed using a thickness of 35 μm for the UBM structures, and improvements in the ESR and ESL were observed throughout. For example, the UBM structure of FIG. 10 has an ESR of 0.19 mΩ and an ESL of 0.96 pH, the UBM structure of FIG. 11 has an ESR of 0.10 mΩ and an ESL of 0.79 pH, and the UBM structure of FIG. 12 has an ESR of 0.08 mΩ and an ESL of 0.66 pH.

In some embodiments, the topmost RDL 131 (see FIG. 1) of the InFO package 1100 to which the IPD is attached is designed in accordance with the design of the conductive patterns 187P/187G of the topmost metallization layer 187, to further reduce the ESL of the IPD. FIGS. 13A, 13B, 14A, 14B, 15, 16, 17A, and 17B illustrate various embodiments showing the design and the interaction between the topmost RDL 131 and the conductive patterns 187P/187G of the topmost metallization layer 187.

Figure 13A:
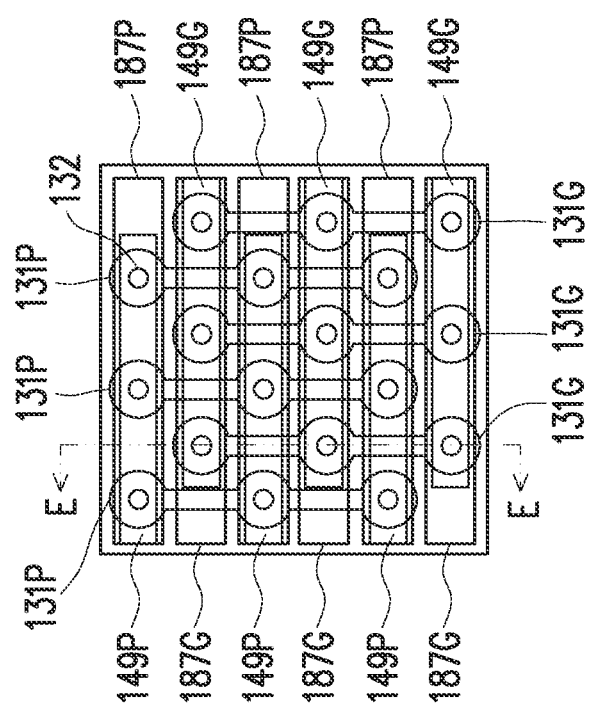

FIG. 13A illustrates a plan view showing the topmost RDL 131 of the InFO package 1100, vias 132 (see FIG. 1) of the redistribution structure 140 of the InFO package 1100, conductive patterns 149P/149G of the UBM structure 149 (see FIG. 1) of the InFO package 1100, and the conductive patterns 187P/187G of the topmost metallization layer 187 of the IPD 180, in an embodiment. For clarity, not all features are illustrated in FIG. 13A. As discussed earlier, the conductive patterns 149P/149G of the UBM structure 149 of the InFO package may match (e.g., having a same shape and/or a same size as) the conductive patterns 189P/189G of the UBM structure 189 of the IPD. For example, in the plan view, each of the conductive patterns 149P matches a respective conductive pattern 189P, and is electrically coupled (e.g., by solder region 173) to the respective conductive pattern 189P. Similarly, each of the conductive patterns 149G matches a respective conductive pattern 189G, and is electrically coupled (e.g., by solder region 173) to the respective conductive pattern 189G.

In FIG. 13A, the topmost RDL 131 has conductive patterns 131P that are interleaved with conductive patterns 131G. The conductive patterns 131P are electrically coupled to the conductive patterns 149P by vias 132, and the conductive patterns 131G are electrically coupled to conductive patterns 149G by vias 132. As illustrated in FIG. 13A, the conductive patterns 131P/131G are perpendicular to the conductive patterns 187P/187G. In other words, the longitudinal axes of the conductive patterns 131P/131G are perpendicular to the longitudinal axes of the conductive patterns 187P/187G.

Figure 13B:
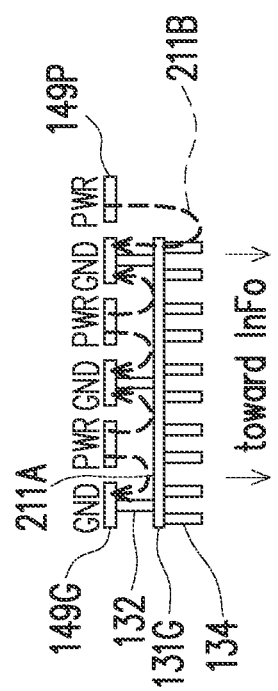

FIG. 13B illustrates the cross-sectional view of FIG. 13A along cross-section E-E. For clarity, only portions of the InFO package 1100 proximate the IPD are illustrated in FIG. 13B. FIG. 13B shows the interleaved conductive patterns 149P/149G of the UBM structure 149. The dashed arrow lines 211 (e.g., 211A, 211B) illustrate the current paths from the power patterns 149P (e.g., connected to power supply) to the ground patterns 149G (e.g., connected to electrical ground). In some embodiments, as illustrated by the current path 211A, electrical current flows from the power patterns 149P to the conductive patterns 131G of the topmost RDL layer 131 through a via 132 (not visible in the cross-section E-E), and flows back to the ground patterns 149G through another via 132. In some embodiments, as illustrated by the current path 211B, electrical current flows from the power patterns 149P to an RDL layer below (e.g., closer to the die 120 than 131) the topmost RDL 131 through vias 132/134 (not visible in the cross-section E-E), and flows back to the ground patterns 149G through another via 134, the conductive pattern 131G, and another via 132.

Figure 14A:
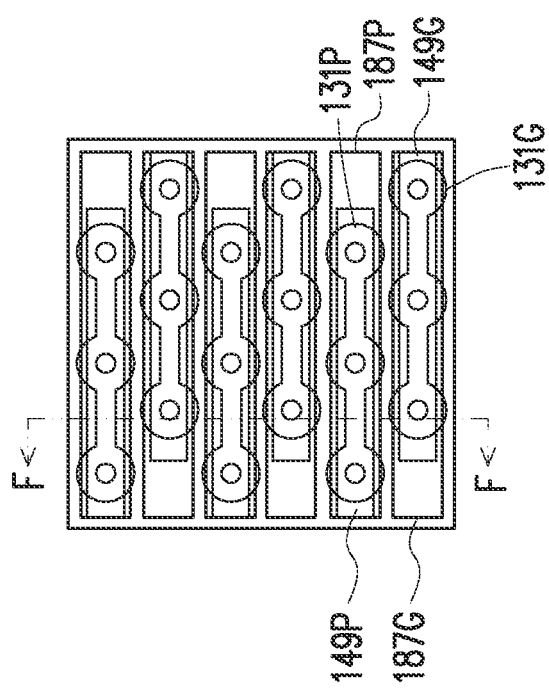
Figure 14B:
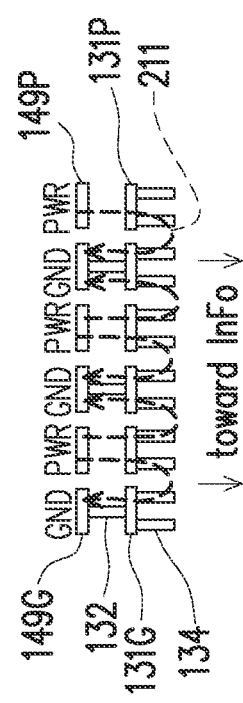

FIG. 14A shows a plan view of another embodiment design similar to FIG. 13A, but with the conductive patterns 131P/131G being parallel with the conductive patterns 187P/187G. FIG. 14B illustrates a cross-sectional view along cross-section F-F in FIG. 14A. The dashed arrow lines 211 in FIG. 14B illustrate the current paths, similar to FIG. 13B. In some embodiments, the design of the conductive patterns 131P/131G in FIG. 13A, by having 131P/131G being perpendicular to conductive patterns 187P/187G, further reduces the ESL by shunting the current paths between the topmost RDL 131 and the topmost metallization layer 187.

FIGS. 15 and 16 illustrate two additional embodiment designs for the topmost RDL 131 of the InFO package and the topmost metallization layer 187 of the IPD. In FIG. 15, the conductive patterns 131P/131G have a same size and a same shape with the conductive patterns 149P/149G of the UBM structure 149, thus in the plan view of FIG. 15, the conductive patterns 131P/131G overlap completely with the conductive patterns 149P/149G. Furthermore, since the conductive patterns 149P/149G of FIG. 15 match (e.g., having a same shape and a same size) the conductive patterns 189P/189G of the UBM structure 189 of the IPD, the conductive patterns 131P/131G also match (e.g., having a same size and a same shape with) the conductive patterns 189P/189G of the UBM structure 189. As illustrated in FIG. 15, the conductive patterns 131P/131G are perpendicular to the conductive patterns 187P/187G of the topmost metallization layer 187 of the IPD. In FIG. 16, the conductive patterns 131P/131G are also perpendicular to the conductive patterns 187P/187G of the IPD, but have a different shape from the conductive patterns 149P/149G.

Figure 17A:
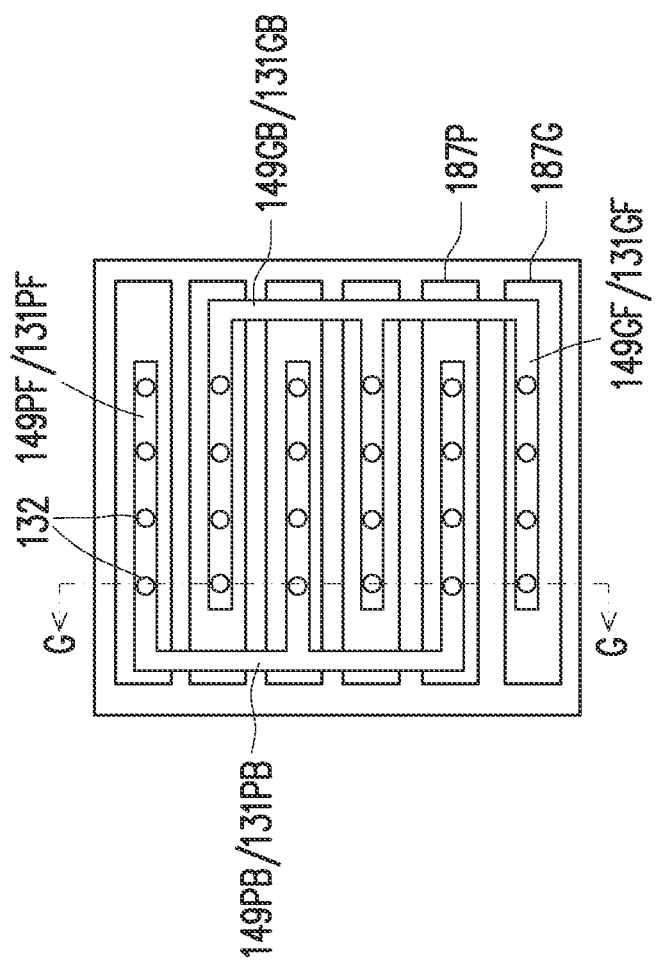

FIG. 17A illustrates another embodiment design for the topmost RDL 131 of the InFO package and the topmost metallization layer 187 of the IPD. In FIG. 17A, the topmost RDL 131 comprises comb-shaped conductive patterns (e.g., 131PB/131PF, 131GB/131GF) that overlap completely with comb-shaped conductive patterns (e.g., 149PB/149PF, 149GB/149GF) of the UBM structure 149. For example, the comb-shaped conductive patterns of the topmost RDL 131 include base 131PB (or 131GB) that are connected to fingers 131PF (or 131GF). Similarly, the comb-shaped conductive patterns of the UBM structure 149 include base 149PB (or 149GB) that are connected to fingers 149PF (or 149GF).

Figure 17B:
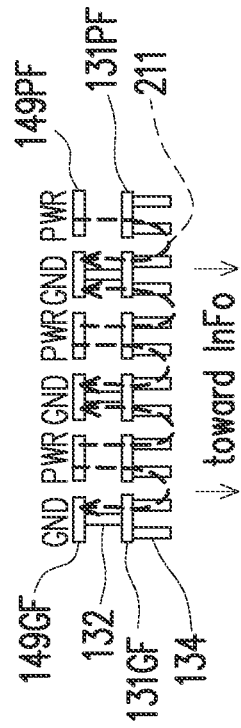

FIG. 17B illustrates the cross-sectional view of FIG. 17A along cross-section G-G. FIG. 17B also illustrates the current paths 211, similar to FIG. 13B. The interleaved power/ground patterns provided by, e.g., the interleaved fingers 149PF/149GF of the comb-shaped UBM patterns of the UBM structure 149, together with the interleaved fingers (e.g., 131GF/131PF) of the topmost RDL 131, provide multiple parallel conductive paths that shunt the current paths into the InFO package, thus further reducing the ESL of the IPD formed. The multiple parallel conductive paths in other embodiment designs, such as those illustrated in FIGS. 13B and 14B, may reduce the ESL for similar reasons.

Figure 18:
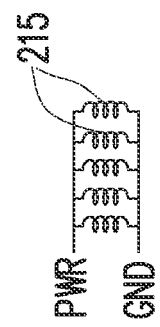
FIG. 18 is a circuit diagram illustrating parallel coupling of multiple inductors, in some embodiments.

FIG. 18 is a circuit diagram illustrating the reduction of inductance by parallel coupling of multiple inductors. In the example of FIG. 18, a plurality of inductors 215 are coupled in parallel. The equivalent inductance of the plurality of parallel connected inductors 215 is smaller than the inductance of any of the inductors 215, as one skilled in the art ready appreciates. For example, if five inductors 215, each with an inductance of L, are parallel connected, the equivalent inductance of the parallel connected inductors 215 is L/5. This may further explain the reason for the reduction of ESL by using the interleaved power/ground patterns, as discussed above.

Figure 19:
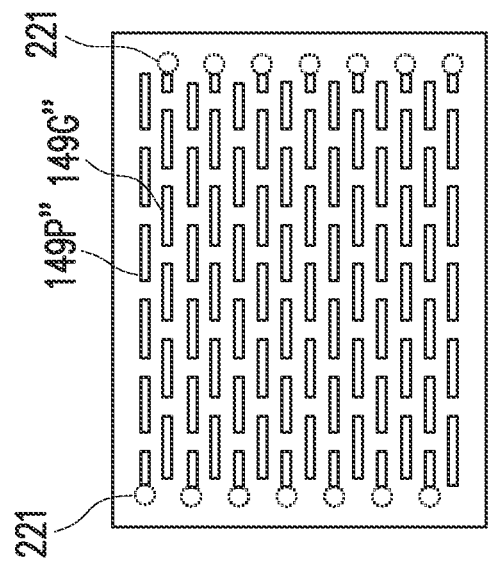
FIGS. 19 and 20 illustrate various designs for the conductive patterns of the UBM structure of the InFO package, in some embodiments.
Figure 20:
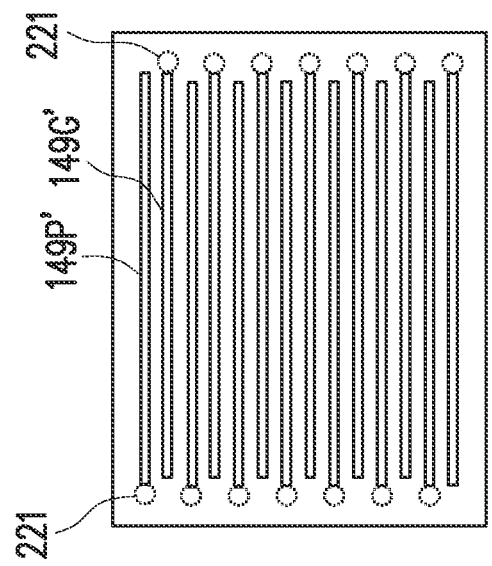

FIGS. 19 and 20 illustrate various modifications of the conductive patterns 149P/149G of the UBM structure 149 of the InFO package 1100, to overcome certain manufacturing problems. For example, as feature size continues to shrink in semiconductor manufacturing, the pitch between two adjacent conductive patterns 149P and 149G may be so small that solder bridging problem may occur when the conductive patterns 149P/149G are bonded to conductive patterns 189P/189G of the IPD 180 using solder. Solder bridging causes electrical short, which may cause malfunction and/or damage of the semiconductor device formed. Another problem during manufacturing is the so-called pre-fill void problem, where voids (e.g., empty spaces) may form between the conductive patterns (e.g., between 149P and 149G, or between 189P and 189G), when an underfill material (not illustrated in FIG. 1) is used to fill the space between the InFO package 1100 and the IPD 180.

FIG. 19 illustrates modified strip-shaped conductive patterns 149P'/149G'. As illustrated in FIG. 19, an enlarged conductive pattern 221 (e.g., a metal pattern such as a copper pattern, or a copper pad) is formed at the end of each of the conductive patterns 149P/149G to form the modified conductive patterns 149P'/149G'. The enlarged conductive patterns 221 help to absorb excess solder applied during bonding, thus reducing or avoiding the solder bridging problem. The enlarged conductive patterns 221 may be formed in a same processing step used to form the original conductive patterns 149P/149G. The shape of the conductive patterns 221 may be round, oval, tear shaped, rectangular, or any suitable shape. A width, or a diameter, of the enlarged conductive pattern 221 is between about 5 μm and about 100 μm, in some embodiments.

FIG. 20 illustrates other modified conductive patterns 149P'''/149G'''. The conductive patterns 149P'''/149G''' are similar to conductive patterns 149P'/149G' in FIG. 19, but with each of the strip-shaped conductive patterns 149P/149G replaced by a plurality of segmented strips, which segmented strips may have longitudinal axes aligned on a same line (e.g., the longitudinal axis of the original conductive pattern 149P/149G). The openings between the segmented strips allow the underfill material to better flow into the space between adjacent conductive patterns 149P'''/149G''', thus reducing or avoiding the pre-fill void problem. In some embodiments, by using the modified design for the conductive patterns (e.g., 149P'/149G', 149P'''/149G''') illustrated in FIGS. 19 and 20, the conductive patterns of the UBM structure 149 of the InFO package no longer match the conductive patterns (e.g., 189P/189G) of the UBM structure 189 of the IPD, due to the enlarged conductive pattern 221 and/or the segmented strips in the modified design.

FIGS. 19 and 20 uses the strip-shaped conductive patterns as examples. However, the principle may also be used with comb-shaped conductive patterns. For example, the enlarged area may be formed at the end of each finger of a comb-shaped conductive pattern of the UBM structure 149. In addition, each finger may be replaced by a plurality of segmented strips. These and other modifications are fully intended to be included within the scope of the present disclosure.

Figure 22:
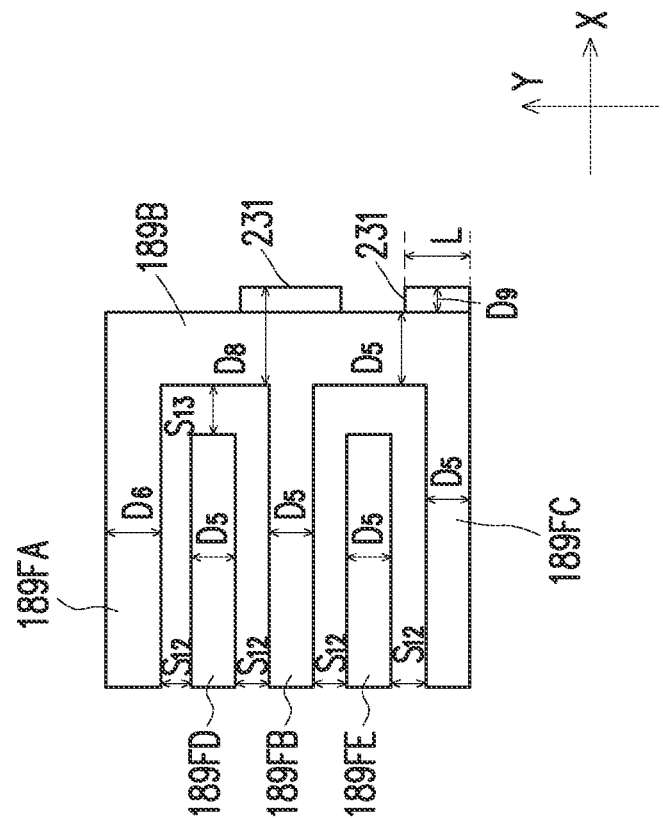
FIGS. 21 and 22 illustrate various designs for the under bump metallization (UBM) structure of the IPD, in some embodiments.
Figure 21:
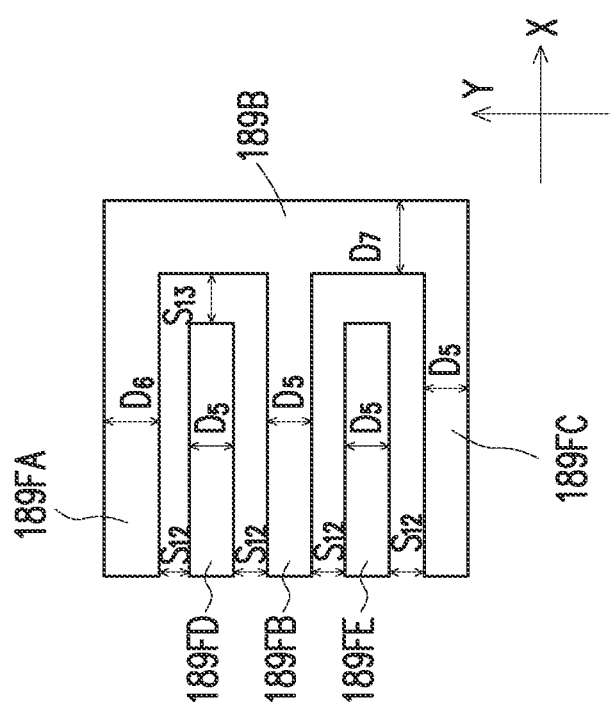

FIGS. 21 and 22 illustrate various modified designs for the UBM structure 189 of the IPD 180, in some embodiments. FIG. 21 shows a comb-shaped conductive pattern with base 189B and fingers 189FA/189FB/189FC attached to the base 189B. In addition, FIG. 21 illustrates two fingers 189FD and 189FE of another comb-shaped conductive pattern. In a simplistic design, all the fingers and the base may have a same width $D_5$, which may be in a range between about 5 μm and about 50 μm. However, as feature size continues to shrink, solder bridging becomes more likely, especially in the areas where the fingers adjoin the base.

To overcome the solder bridging problem, the base 189B of the comb-shaped conductive pattern is widened to have a width $D_7$, which may be in a range between about 5 μm and about 100 μm. Widening the base 189B spreads out the solder, thus reducing the solder bridging problem. In addition, one of the fingers connected to an end of the base 189B, such as the finger 189FA, may be widened to have a width $D_6$, which may be in a range between about 5 μm and about 100 μm. Widening the finger 189FA may be especially useful when the finger 189FA is close to another adjacent conductive feature (e.g., another conductive pattern). To further reduce solder bridging, a distance S13 between the ends of the fingers 189FD/189FE and the base 189B may be increased to a value between about 5 μm and about 100 μm, while the distance S12 between adjacent fingers may be kept at a smaller value between about 5 μm and about 50 μm.

FIG. 22 illustrates another modified design for the UBM structure 189 of the IPD 180. The conductive patterns of the UBM structure 189 in FIG. 22 are similar to those of FIG. 21, but with modifications. In particular, the base 189B of the comb-shaped conductive pattern has a same width $D_5$ with the fingers. In addition, extension areas 231 are formed proximate where the fingers adjoin the base 189B. The extension areas 231 may be conductive patterns (e.g., metal patterns such as copper patterns) formed at a same processing step used to form the comb-shaped conductive patterns. A length L of the A extension areas 231 may be in a range between about 5 μm and about 100 μm. A width D9 of the extension areas 231 may be in a range between about 5 μm and about 100 μm, such that a width D8, which is the sum of D5 and D9, is in a range between about 10 μm and about 200 μm. The shape of the extension area 231 are illustrated as rectangle for illustration purpose, but other suitable shape, such as oval, circle, race-track shape (a rectangle with semicircles at opposing ends of the rectangle), or the like, may also be used. In some embodiments, by using the modified design for the comb-shaped conductive patterns illustrated in FIGS. 21 and 22, the comb-shaped conductive patterns of the UBM structure 189 of the IPD no longer match the comb-shaped conductive patterns (e.g., 149PB/149PF, 149GB/149GF) of the UBM structure 149 of the InFO package.

Figure 23:
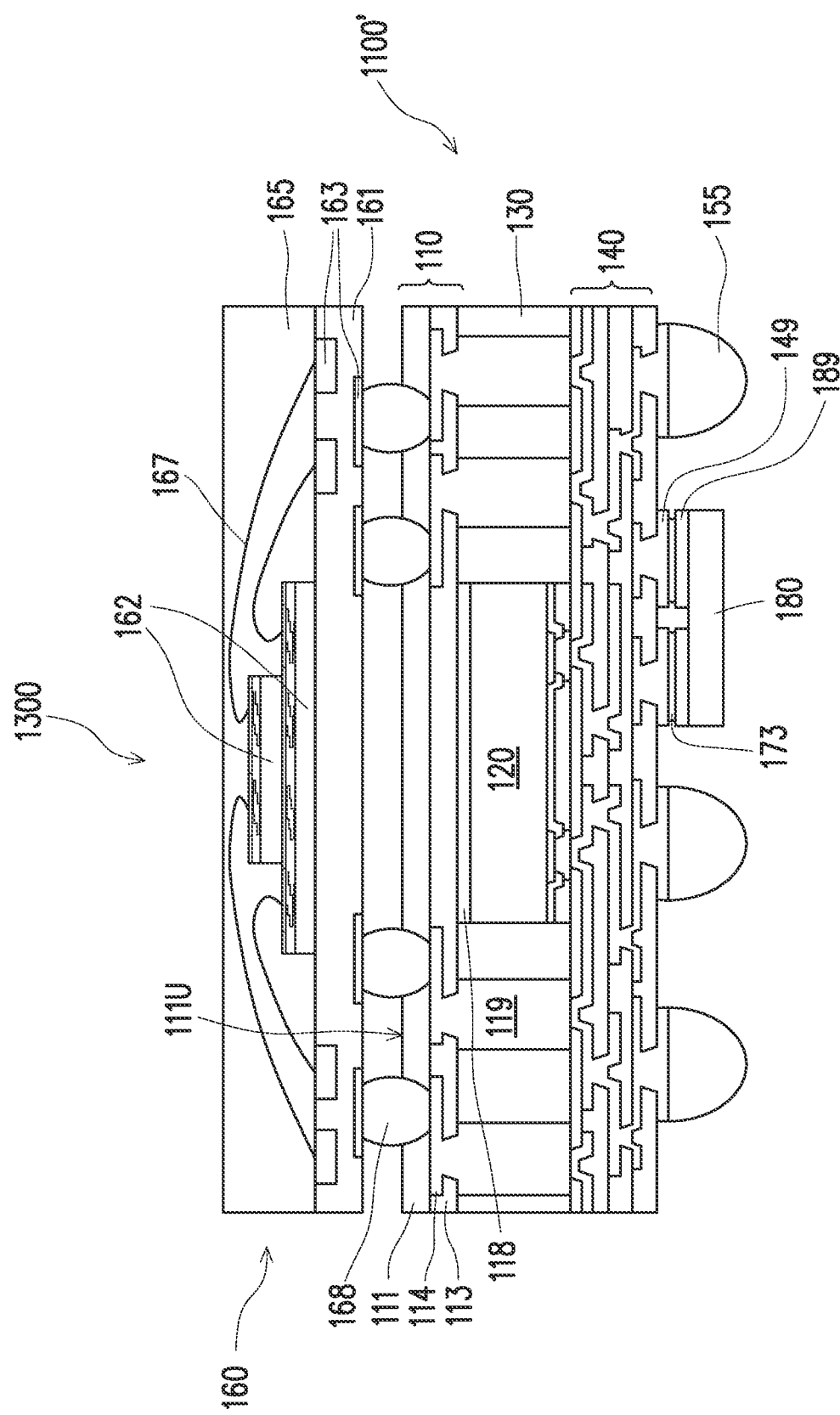
FIG. 23 illustrates a cross-sectional view of a semiconductor device, in some embodiments.

FIG. 23 illustrates a cross-sectional view of a semiconductor package 1300 comprising a bottom package 1100', a top package 160, and an IPD 180, in some embodiments. The semiconductor package 1200 illustrated in FIG. 1 may correspond to a portion of the semiconductor package 1300 illustrated in FIG. 23.

In FIG. 23, an IPD 180, which may be any of the above disclosed IPDs (e.g., 180A, 180B, 180C, 180D, 180E, and 180F), is attached to a bottom package 1100', which is an InFO package such as the InFO package 1100 of FIG. 1. The bottom package 1100' has a die 120 between a front side redistribution structure 140 and a backside redistribution structure 110. The front side redistribution structure 140 may be the same or similar to the redistribution structure 140 of FIG. 1, and the backside redistribution structure 110 include conductive features (e.g., conductive lines 114 and vias) formed in one or more dielectric layers (e.g., 111/113). A molding material 130 is formed between the front side redistribution structure 140 and the backside redistribution structure 110. Conductive pillars 119, such as copper pillars, are formed in the molding material 130. The conductive pillars 119 electrically couple the front side redistribution structure 140 with the backside redistribution structure 110.

Still referring to FIG. 23, a top package 160, which may be a memory package, is bonded to the bottom package 1100' through conductive joints 168. As illustrated in FIG. 23, the top package 160 has a substrate 161 and one or more semiconductor dies 162 (e.g., memory dies) attached to an upper surface of the substrate 161. In some embodiments, the substrate 161 includes silicon, gallium arsenide, silicon on insulator ("SOI") or other similar materials. In some embodiments, the substrate 161 is a multiple-layer circuit board. In some embodiments, the substrate 161 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 161 may include conductive features (e.g., conductive lines and vias) formed in/on the substrate 161. As illustrated in FIG. 23, the substrate 161 has conductive pads 163 formed on the upper surface and a lower surface of the substrate 161, which conductive pads 163 are electrically coupled to the conductive features of the substrate 161. The one or more semiconductor dies 162 are electrically coupled to the conductive pads 163 by, e.g., bonding wires 167. A molding material 165, which may comprise an epoxy, an organic polymer, a polymer, or the like, is formed over the substrate 161 and around the semiconductor dies 162. In some embodiments, the molding material 165 may be conterminous with the substrate 161, as illustrated in FIG. 23.

In some embodiments, a reflow process is performed to electrically and mechanically coupled the semiconductor package 160 to the backside redistribution structure 110. Conductive joints 168 are formed between the conductive pads 163 and the conductive feature 114. In some embodiments, the conductive joints 168 comprise solder regions, conductive pillars (e.g., copper pillars with solder regions on at least end surfaces of the copper pillars), or any other suitable conductive joints.

Modifications to the various disclosed embodiments are possible and are fully intended to be included within the scope of the present disclosure. For example, the number of strip-shaped conductive patterns (e.g., 187P/187G, 189P/189G) and the number of fingers for the comb-shaped conductive patterns may be modified to any suitable number. As another example, the width and the length of the various conductive patterns (e.g., 187P/187G) of the topmost metallization layer 187 may be adjusted (e.g., equal to, smaller than, or larger than) relative to those of the corresponding conductive patterns (e.g., 189P/189G) of the UBM structure 189, thus not limited to what was illustrated in the various embodiments. The shapes of the vias (e.g., 188) in various embodiments may be any suitable shape, in addition to the illustrated shapes. Furthermore, while the conductive patterns in FIGS. 19 and 20 are described as designs for the UBM structure 149 of the InFO package, these designs may be applied to the UBM structure 189 of the IPD. Conversely, the conductive patterns for the IPD illustrated in FIGS. 21-22 may be applied to the UBM structure 149 of the InFO package.

Embodiments may achieve advantages. For example, the strip-shaped UBM structures 189 (see, e.g., FIGS. 2 and 3) of the IPD and the comb-shaped UBM structures 189 (see, e.g., FIGS. 4A, 5A, 6A and 7A) of the IPD provide high coverage ratio which allows for high density vias to be formed between the UBM structures 189 and the topmost metallization layer 187 of the IPD, thus reducing the ESR of the IPD formed. In addition, the interleaved power/ground patterns, provided by the interleaved conductive patterns 189P/189G of the strip-shaped UBM structure 189, or by the interleaved fingers 189PF/189GF of the comb-shaped UBM structure 189, shunt the current paths to reducing the ESL of the IPD formed. The modified UBM conductive patterns, such as illustrated in FIGS. 19-22, reduce solder bridging and/or pre-fill voids, thus improving the reliability and the manufacturing yields of the semiconductor device formed.

FIG. 24 illustrates a flow chart of a method 3000 of fabricating a semiconductor device, in accordance with some embodiments. It should be understood that the embodiment method shown in FIG. 24 is merely an example of many possible embodiment methods. One of ordinary skill in the art would recognize many variations, alternatives, and modifications. For example, various steps as illustrated in FIG. 24 may be added, removed, replaced, rearranged and repeated.

Referring to FIG. 24, at step 3010, an interconnect structure is formed over passive devices over a substrate, the interconnect structure electrically coupled to the passive devices, a top metallization layer of the interconnect structure comprising first metal patterns and second metal patterns parallel to the first metal patterns. The interconnect structure may be, e.g., interconnect structure 199 in FIG. 1, and the passive device may be, e.g., passive devices 183. The top metallization layers 187 of the interconnect structure may include first metal patterns (e.g., 187P) and second metal patterns (e.g., 187G) that are parallel to each other. At step 3020, a first under bump metallization (UBM) structure is formed over the interconnect structure, the first UBM structure comprising first metal strips and second metal strips parallel to the first metal strips, the first metal strips electrically coupled to respective ones of the first metal patterns, and the second metal strips electrically coupled to respective ones of the second metal patterns. The first UBM structure (e.g., 189) may include first metal strips (e.g., 189P, 189PF, or 189GF) and second metal strips (e.g., 189G, 189PF, or 189GF) that are parallel to each other. The first metal strips and the second metal strips may be electrically coupled to respective metal patterns (e.g., 187P, or 187G) by, e.g., vias 188. The first metal strips (e.g., 189P) may be parallel (see, e.g., FIG. 2) to the first metal patterns (e.g., 187P), or may be perpendicular (see, e.g., FIG. 3) to the first metal patterns.

In an embodiment, a semiconductor package includes an integrated passive device (IPD) including one or more passive devices over a first substrate; and metallization layers over and electrically coupled to the one or more passive devices, where a topmost metallization layer of the metallization layers includes a first plurality of conductive patterns; and a second plurality of conductive patterns interleaved with the first plurality of conductive patterns. The IPD also includes a first under bump metallization (UBM) structure over the topmost metallization layer, where the first UBM structure includes a first plurality of conductive strips, each of the first plurality of conductive strips electrically coupled to a respective one of the first plurality of conductive patterns; and a second plurality of conductive strips interleaved with the first plurality of conductive strips, each of the second plurality of conductive strips electrically coupled to a respective one of the second plurality of conductive patterns. In an embodiment, the first plurality of conductive strips are configured to be electrically coupled to a power supply, and the second plurality of conductive strips are configured to be electrically coupled to a reference voltage. In an embodiment, the first plurality of conductive patterns is parallel with the first plurality of conductive strips. In an embodiment, the first UBM structure of the IPD further includes a first conductive strip perpendicular to the first plurality of conductive strips, the first conductive strip being in a same plane with the first plurality of conductive strips, the first conductive strip physically connected to the first plurality of conductive strips; and a second conductive strip perpendicular to the second plurality of conductive strips, the second conductive strip being in a same plane with the second plurality of conductive strips, the second conductive strip physically connected to the second plurality of conductive strips. In an embodiment, the first plurality of conductive patterns is perpendicular to the first plurality of conductive strips. In an embodiment, the first UBM structure of the IPD further includes a first conductive strip perpendicular to the first plurality of conductive strips, the first conductive strip being in a same plane with the first plurality of conductive strips, the first conductive strip physically connected to the first plurality of conductive strips; and a second conductive strip perpendicular to the second plurality of conductive strips, the second conductive strip being in a same plane with the second plurality of conductive strips, the second conductive strip physically connected to the second plurality of conductive strips. In an embodiment, the semiconductor package further includes an integrated fan-out (InFO) package, the InFO package including a die embedded in a molding material; a redistribution structure on the die and the molding material, the redistribution structure being electrically coupled to the die, where a top redistribution layer of the redistribution structure includes: a third plurality of conductive patterns; and a fourth plurality of conductive patterns interleaved with the third plurality of conductive patterns; and a second UBM structure on the redistribution structure, the second UBM structure being electrically coupled to the top redistribution layer of the redistribution structure, the second UBM structure being bonded to the first UBM structure, the third plurality of conductive patterns being electrically coupled to the first plurality of conductive patterns through the second UBM structure, the fourth plurality of conductive patterns being electrically couple to the second plurality of conductive patterns through the second UBM structure. In an embodiment, the second UBM structure has a same size and a same shape as the first UBM structure. In an embodiment, the second UBM structure of the InFO package includes: a third plurality of conductive strips electrically coupled to the first plurality of conductive strips of the first UBM structure; and a fourth plurality of conductive strips electrically coupled to the second plurality of conductive strips of the first UBM structure, where each of the third plurality of conductive strips includes discontinuous segments disposed along a line, and each of the fourth plurality of conductive strips comprises discontinuous segments disposed along a line. In an embodiment, the third plurality of conductive patterns is parallel to the first plurality of conductive patterns, and the fourth plurality of conductive patterns is parallel to the second plurality of conductive patterns. In an embodiment, the third plurality of conductive patterns is perpendicular to the first plurality of conductive patterns, and the fourth plurality of conductive patterns is perpendicular to the second plurality of conductive patterns.

In an embodiment, a semiconductor package includes an integrated passive device (IPD) including passive devices over a substrate; an inter-connect structure over the passive devices and the substrate, a top metallization layer of the inter-connect structure having first metal patterns and second metal patterns parallel to the first metal patterns, the second metal patterns interleaved with the first metal patterns; and a first under bump metallization (UBM) structure electrically coupled to the top metallization layer of the inter-connect structure, the first UBM structure having first metal strips and second metal strips parallel to the first metal strips, the second metal strips interleaved with the first metal strips, the first metal strips being electrically coupled to the first metal patterns, and the second metal strips being electrically coupled to the second metal patterns. The semiconductor package further includes an integrated fan-out (InFO) package including a die embedded in a molding material; a redistribution structure over the molding material, the redistribution structure electrically coupled to the die; and a second UBM structure electrically coupled to the redistribution structure, a shape of the second UBM structure matching a shape of the first UBM structure, the second UBM structure being bonded to the first UBM structure. In an embodiment, the first metal strips are parallel with the first metal patterns. In an embodiment, the first metal strips are perpendicular to the first metal patterns. In an embodiment, the first UBM structure of the IPD further includes a third metal strip physically connected to the first metal strips, where the third metal strip is perpendicular to the first metal strips, and where a width of the third metal strip is larger than a width of at least one of the first metal strips. In an embodiment, a top redistribution layer of the redistribution structure of the InFO package includes third metal patterns and fourth metal patterns, and where a shape of the third metal patterns match a shape of the first metal strips of the first UBM structure, and a shape of the fourth metal patterns match a shape of the second metal strips of the first UBM structure.

In an embodiment, a method includes forming an interconnect structure over passive devices over a substrate, the interconnect structure electrically coupled to the passive devices, a top metallization layer of the interconnect structure comprising first metal patterns and second metal patterns parallel to the first metal patterns; and forming a first under bump metallization (UBM) structure over the interconnect structure, the first UBM structure comprising first metal strips and second metal strips parallel to the first metal strips, the first metal strips electrically coupled to respective ones of the first metal patterns, and the second metal strips electrically coupled to respective ones of the second metal patterns. In an embodiment, forming the first UBM structure includes forming the first metal strips to be perpendicular to the first metal patterns. In an embodiment, the method further includes bonding the first UBM structure to a second UBM structure of a semiconductor package, where the bonding couples the first metal strips to a power supply of the semiconductor package, and couples the second metal strips to an electrical ground of the semiconductor package. In an embodiment, the semiconductor package includes a redistribution structure electrically coupled to a die, where the second UBM structure is electrically coupled to the redistribution structure, where a top redistribution layer of the redistribution structure distal the die comprises third metal strips and fourth metal strips parallel to the third metal strips, where the third metal strips are perpendicular with the first metal patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
an integrated passive device (IPD) comprising:
one or more passive devices on a first substrate;
an interconnect structure over and electrically coupled to the one or more passive devices, wherein a top metallization layer of the interconnect structure distal from the first substrate comprises:

a first plurality of conductive patterns configured to be electrically coupled to a power supply; and
a second plurality of conductive patterns interleaved with the first plurality of conductive patterns and configured to be electrically coupled to an electrical ground; and
a first under bump metallization (UBM) structure over the top metallization layer, wherein the interconnect structure is between the first substrate and the first UBM structure, wherein the first UBM structure comprises:
a first plurality of conductive strips, each of the first plurality of conductive strips electrically coupled to a respective one of the first plurality of conductive patterns; and
a second plurality of conductive strips interleaved with the first plurality of conductive strips, each of the second plurality of conductive strips electrically coupled to a respective one of the second plurality of conductive patterns.

2. The semiconductor package of claim 1, wherein the interconnect structure further comprises a plurality of vias between the first UBM structure and the top metallization layer, wherein each via of the plurality of vias electrically couples a conductive pattern of the top metallization layer to a respective conductive strip of the first UBM structure.

3. The semiconductor package of claim 2, wherein in a top view, an area of each of the via is between about 50% and about 99% of an area of the respective conductive strip.

4. The semiconductor package of claim 1, wherein the first plurality of conductive patterns is parallel with the first plurality of conductive strips.

5. The semiconductor package of claim 4, wherein the first UBM structure further comprises:
a first conductive strip perpendicular to the first plurality of conductive strips and physically connected to the first plurality of conductive strips; and
a second conductive strip perpendicular to the second plurality of conductive strips and physically connected to the second plurality of conductive strips, wherein the first plurality of the conductive strips and the second plurality of conductive strips are disposed between the first conductive strip and the second conductive strip.

6. The semiconductor package of claim 1, wherein the first plurality of conductive patterns is perpendicular to the first plurality of conductive strips.

7. The semiconductor package of claim 6, wherein the first UBM structure further comprises:
a first conductive strip perpendicular to the first plurality of conductive strips and physically connected to the first plurality of conductive strips; and
a second conductive strip perpendicular to the second plurality of conductive strips and physically connected to the second plurality of conductive strips, wherein the first plurality of the conductive strips and the second plurality of conductive strips are disposed between the first conductive strip and the second conductive strip.

8. The semiconductor package of claim 1, further comprising an integrated fan-out (InFO) package bonded to the integrated passive device, the InFO package comprising:
a die;
a molding material around the die;
a redistribution structure at a front side of the die and electrically coupled to the die, wherein a top redistribution layer of the redistribution structure comprises:
a third plurality of conductive patterns; and
a fourth plurality of conductive patterns interleaved with the third plurality of conductive patterns; and
a second UBM structure at a first side of the redistribution structure facing away from the die, the second UBM structure being electrically coupled to the top redistribution layer of the redistribution structure, the second UBM structure being bonded to the first UBM structure, wherein the third plurality of conductive patterns and the fourth plurality of conductive patterns are electrically coupled to the first plurality of conductive patterns and the second plurality of conductive patterns, respectively, through the second UBM structure.

9. The semiconductor package of claim 8, wherein the second UBM structure has a same size and a same shape as the first UBM structure, wherein the semiconductor package further comprises a solder region between the first UBM structure and the second UBM structure.

10. The semiconductor package of claim 8, wherein the third plurality of conductive patterns is parallel to the first plurality of conductive patterns, and the fourth plurality of conductive patterns is parallel to the second plurality of conductive patterns.

11. The semiconductor package of claim 8, wherein the third plurality of conductive patterns is perpendicular to the first plurality of conductive patterns, and the fourth plurality of conductive patterns is perpendicular to the second plurality of conductive patterns.

12. A semiconductor package comprising:
an integrated passive device (IPD) comprising:
passive devices on a substrate;
an inter-connect structure over the passive devices and the substrate, a top metallization layer of the interconnect structure having first metal patterns and second metal patterns interleaved with the first metal patterns; and
a first under bump metallization (UBM) structure electrically coupled to the top metallization layer, the first UBM structure having first metal strips and second metal strips interleaved with the first metal strips, the first metal strips being electrically coupled to the first metal patterns, and the second metal strips being electrically coupled to the second metal patterns;
an integrated fan-out (InFO) package comprising:
a die embedded in a molding material;
a redistribution structure on the molding material and electrically coupled to the die; and
a second UBM structure electrically coupled to the redistribution structure; and
a solder region between and contacting the first UBM structure and the second UBM structure.

13. The semiconductor package of claim 12, wherein the second UBM structure comprises third metal strips and fourth metal strips interleaved with the third metal strips, wherein the third metal strips are bonded to the first metal strips by the solder region, and the fourth metal strips are bonded to the second metal strips by the solder region.

14. The semiconductor package of claim 12, wherein the first metal patterns are configured to be electrically coupled to a power supply, and the second metal patterns are configured to be electrically coupled to an electrical ground.

15. The semiconductor package of claim 12, wherein the first metal strips are parallel with the first metal patterns or are perpendicular to the first metal patterns.

16. The semiconductor package of claim 12, wherein a top redistribution layer of the redistribution structure of the InFO package comprises third metal patterns and fourth metal patterns interleaved with the third metal patterns, and wherein a shape of the third metal patterns matches a shape of the first metal strips of the first UBM structure, and a shape of the fourth metal patterns matches a shape of the second metal strips of the first UBM structure.

17. A method comprising:
   forming an interconnect structure over passive devices formed on a substrate, the interconnect structure electrically coupled to the passive devices, a top metallization layer of the interconnect structure comprising first metal patterns and second metal patterns interleaved with the first metal patterns, the first metal patterns and the second metal patterns configured to be coupled to a power supply and an electrical ground, respectively; and
   forming a first under bump metallization (UBM) structure over the interconnect structure, the first UBM structure comprising first metal strips and second metal strips interleaved with the first metal strips, the first metal strips electrically coupled to respective ones of the first metal patterns, and the second metal strips electrically coupled to respective ones of the second metal patterns.

18. The method of claim 17, wherein forming the first UBM structure comprises forming the first metal strips to be parallel or perpendicular to the first metal patterns.

19. The method of claim 17, further comprising:
   bonding the first UBM structure to a second UBM structure of a semiconductor package using solder.

20. The method of claim 19, wherein the semiconductor package comprises:
   a die surrounded by a molding material;
   a redistribution structure electrically coupled to the die, wherein a top redistribution layer of the redistribution structure distal from the die comprises third metal patterns and fourth metal patterns interleaved with the third metal patterns; and
   the second UBM structure on the redistribution structure and electrically coupled to the redistribution structure.

* * * * *